(12) United States Patent
Zhu

(10) Patent No.: US 10,044,401 B2
(45) Date of Patent: Aug. 7, 2018

(54) SIGNAL PROCESSING METHOD, TRANSMITTER, AND COMPRESSIVE SAMPLING RECEIVING DEVICE

(71) Applicant: Huawei Technologies Co., Ltd., Shenzhen (CN)

(72) Inventor: Hufei Zhu, Shenzhen (CN)

(73) Assignee: Huawei Technologies Co., Ltd, Shenzhen (CN)

(\*) Notice: Subject to any disclaimer, the term of this patent is extended or adjusted under 35 U.S.C. 154(b) by 0 days.

(21) Appl. No.: 15/394,354

(22) Filed: Dec. 29, 2016

(65) Prior Publication Data
US 2017/0111082 A1 Apr. 20, 2017

Related U.S. Application Data

(63) Continuation of application No. PCT/CN2014/081507, filed on Jul. 2, 2014.

(51) Int. Cl.
*H04B 1/66* (2006.01)
*H04B 7/0456* (2017.01)

(52) U.S. Cl.
CPC ............ *H04B 1/66* (2013.01); *H04B 7/0456* (2013.01)

(58) Field of Classification Search
CPC ...... H04B 1/66; H04B 7/0456; H03M 7/3062
See application file for complete search history.

(56) References Cited

U.S. PATENT DOCUMENTS

| 6,775,329 B2 | 8/2004 | Alamouti et al. |
| 8,379,745 B1 | 2/2013 | Nabar et al. |
| (Continued) | | |

FOREIGN PATENT DOCUMENTS

| CN | 102291152 A | 12/2011 |
| CN | 103873075 A | 6/2014 |
| WO | 2014094586 A1 | 6/2014 |

OTHER PUBLICATIONS

IEEE Standards Association, IEEE Standard for Information Technology—Telecommunications and Information Exchange Between Systems Local and Metropolitan Area Networks—Specific Requirements; "Part 11: Wireless LAN Medium Access Control (MAC) and Physical Layer (PHY) Specifications; Amendment 4: Enhancements for Very High Throughput for Operation in Bands Below 6 GHz," IEEE Computer Society, IEEE Std 802.11ac™-2013 Dec. 11, 2013, 425 pages.

(Continued)

*Primary Examiner* — Khanh C Tran
(74) *Attorney, Agent, or Firm* — Slater Matsil, LLP

(57) ABSTRACT

Embodiments provide a signal processing method, a transmitter, and a compressive sampling receiving device. The method includes: obtaining a periodic pseudo random sequence used when a compressive sampling receiving device performs frequency mixing. The method also includes selecting 2N information symbols from N radio signals; determining a precoding matrix $\overline{D}$ according to the periodic pseudo random sequence. The method also includes using the precoding matrix to perform precoding processing on the 2N information symbols to obtain 2N precoding results. The method also includes separately transmitting the 2N precoding results to the compressive sampling receiving device by using the 2N carriers.

24 Claims, 9 Drawing Sheets

(56) References Cited

U.S. PATENT DOCUMENTS

| | | |
|---|---|---|
| 9,436,974 B2* | 9/2016 | Lau ................. G01S 7/4808 |
| 2010/0144086 A1 | 6/2010 | Chi |
| 2013/0149959 A1* | 6/2013 | Beadle ............. H04B 1/0025 |
| | | 455/39 |
| 2013/0151924 A1* | 6/2013 | Beadle ............. H04L 69/04 |
| | | 714/763 |
| 2014/0181166 A1* | 6/2014 | Chuang ............ H03M 7/3062 |
| | | 708/250 |

OTHER PUBLICATIONS

IEEE Standards Association, IEEE Standard for Information Technology—Telecommunications and Information Exchange Between Systems Local and Metropolitan Area Networks—Specific Requirements; "Part 11: Wireless LAN Medium Access Control (MAC) and Physical Layer (PHY) Specifications," IEEE Computer Society, IEEE Std 802.11™-2012 (Revision of IEEE Std 802.11-2007), Mar. 29, 2012, 2793 pages.

Mishali, M., et al., "From Theory to Practice: Sub Nyquist Sampling of Sparse Wideband Analog Signals," IEEE Journal of Selected Topics in Signal Processing, vol. 4, Iss. 2, 2010, 17 pages.

* cited by examiner $$\underbrace{\begin{pmatrix} Y_1(e^{j2\pi f T_s}) \\ Y_2(e^{j2\pi f T_s}) \\ \vdots \\ Y_m(e^{j2\pi f T_s}) \end{pmatrix}}_{y(f)} = \underbrace{\begin{pmatrix} \alpha_{1,0} & \cdots & \alpha_{1,M-1} \\ \vdots & \ddots & \vdots \\ \alpha_{m,0} & \cdots & \alpha_{m,M-1} \end{pmatrix}}_{S} \underbrace{\begin{pmatrix} \overline{F}_{L_0} & \cdots & \overline{F}_0 & \cdots & \overline{F}_{-L_0} \\ \vdots & \vdots & \vdots & \vdots & \vdots \end{pmatrix}}_{F} \underbrace{\begin{pmatrix} d_{L_0} & & \\ & \ddots & \\ & & d_{-L_0} \end{pmatrix}}_{D} \underbrace{\begin{pmatrix} X(f-L_0 f_P) \\ \vdots \\ X(f) \\ \vdots \\ X(f+L_0 f_P) \end{pmatrix}}_{z(f)} \quad (20)$$

FIG. 5

$$Y = \begin{bmatrix} y_1^H(f) \\ y_2^H(f) \\ \vdots \\ y_m^H(f) \end{bmatrix} = A \times \quad \text{Matrix } Z$$

FIG. 8

$$Y = \begin{bmatrix} y_1^H(f) \\ y_2^H(f) \\ \vdots \\ y_m^H(f) \end{bmatrix} = A_s \times \quad \text{Matrix } Z'$$

FIG. 9

SIGNAL PROCESSING METHOD, TRANSMITTER, AND COMPRESSIVE SAMPLING RECEIVING DEVICE

CROSS-REFERENCE TO RELATED APPLICATIONS

This application is a continuation of International Application No. PCT/CN2014/081507, filed on Jul. 2, 2014, the disclosure of which is hereby incorporated by reference in its entirety.

TECHNICAL FIELD

Embodiments of the present invention relate to the radio communications field, and more specifically, to a signal processing method, a transmitter, and a compressive sampling receiving device.

BACKGROUND

Conventional signal processing is performed on the basis of a Nyquist sampling theory, that is, a quantity of discrete samples required for reconstructing a signal without distortion is decided by a bandwidth of the signal. Specifically, when a sampling frequency is greater than twice a highest frequency in the signal, information in the original signal is integrally retained in a digital signal obtained after sampling.

In the radio communications field, a spectral bandwidth for transmitting a radio signal tends to increase. As the spectral bandwidth increases, a higher requirement is imposed on a sampling rate of an analog-to-digital converter (ADC). Design of a high-rate ADC increases complexity of terminal design, and is expensive. For example, aggregation of multiple spectral subbands and a dynamic change of a subband frequency have been widely applied to existing radio communications systems. However, an ADC in an existing terminal generally uses a subband sampling manner. That is, one frequency converter and one filter are used for each subband, and one frequency converter and one filter need to be added provided that one subband is added. Due to a limited size of a terminal, requirements of aggregation of multiple spectral subbands and a dynamic change of a subband frequency can be hardly met.

Compressive sampling is a new sampling theory. A signal sparseness characteristic is developed, so that under a condition under which a sampling rate is far less than a Nyquist sampling rate, a discrete sample of a signal is obtained by means of random sampling, and then distortionless reconstruction of the signal is implemented by using a nonlinear reconstruction algorithm. The compressive sampling theory has a low requirement for the sampling frequency, and therefore, has a broad application prospect.

Currently, many communications systems divide one wideband spectrum into multiple narrow bands, and different narrow bands are used to carry different narrowband signals. For example, in an OFDM system, a spectrum is divided into multiple subbands, multiple subbands occupied by one OFDM signal transmitted by a transmitter may be distributed apart in terms of frequencies, and the subbands occupied by the OFDM signal may vary with time dynamically. For this multi-band signal, before performing compressive sampling on a received analog signal, many compressive sampling receiving devices need to learn beforehand information about a frequency band occupied by a to-be-sampled frequency band signal. An MWC (Modulated Wideband Converter) system is proposed by persons such as Moshe Mishali (for details, refer to IEEE Journal of Selected Topics In Signal Processing, Vol. 4, No. 2, April 2010, entitled "From Theory to Practice: Sub-Nyquist Sampling of Sparse Wideband Analog Signal"). The system has multiple sampling channels, and parallel processing is performed on a received signal on the multiple sampling channels. On each sampling channel, the received signal is first multiplied by a periodic pseudo random sequence (or called a frequency mixing function), a result of which is equivalent to shifting a part of a wideband spectrum to the vicinity of a baseband. The part of the wideband spectrum shifted by using the sampling channel depends on a specific form of the periodic pseudo random sequence, which is described in detail by Moshe Mishali in the foregoing document. Then a low-pass filter filters out a part except signals in the vicinity of the baseband, and the signals in the vicinity of the baseband are sampled by using a low-rate ADC whose sampling rate is far less than a Nyquist frequency. Different periodic pseudo random sequences (the periodic pseudo random sequences have a same period $T_p$) are set for different sampling channels, for the purpose of shifting an entire spectrum to a same frequency band near the baseband on a per $f_p=1/T_p$ basis. In this way, no matter which narrow bands are used by a transmit end to send radio signals, spectrums of the radio signals are all shifted to the frequency band near the baseband, and information in the multi-band signals can be restored subsequently by using a signal restoration algorithm.

However, the foregoing compressive sampling manner has the following problem: after frequency mixing is performed on multi-band signals (the signals are aliased to a same frequency band) by using multiple sampling channels of a compressive sampling receiving device, mutual interference exists between the signals. Consequently, a signal to interference plus noise ratio (SINR) of a received signal is low, and an effect of subsequent signal restoration is poor.

SUMMARY

Embodiments of the present invention provide a signal processing method, a transmitter, and a compressive sampling receiving device, to increase an SINR of a received signal.

According to a first aspect, a signal processing method is provided. The method includes obtaining a periodic pseudo random sequence used when a compressive sampling receiving device performs frequency mixing, and selecting 2N information symbols from N radio signals, where the N radio signals are separately located on N narrow bands, the 2N information symbols are separately located on 2N carriers on the N narrow bands, and spectrums of the information symbols on the 2N carriers are shifted to a same frequency band after the frequency mixing is performed; determining a precoding matrix $\overline{D}$ according to the periodic pseudo random sequence, where a conjugate transpose matrix $\overline{D}^H$ of the matrix $\overline{D}$ meets a singular value decomposition formula $A_s = \overline{S}\overline{V}\overline{D}^H$, the matrix $A_s$ is a matrix including columns that are corresponding to the N narrow bands and are in an equivalent channel matrix A, and the matrix A is generated based on the periodic pseudo random sequence. The method also includes using the precoding matrix to perform precoding processing on the 2N information symbols to obtain 2N precoding results, and separately transmitting the 2N precoding results to the compressive sampling receiving device by using the 2N carriers.

With reference to the first aspect, in an implementation manner of the first aspect, the using the precoding matrix to perform precoding processing on the 2N information symbols to obtain 2N precoding results includes: taking a conjugate of one half of the 2N information symbols, and keeping the other half unchanged, to obtain 2N to-be-precoded entries; multiplying the precoding matrix by a column vector that includes the 2N to-be-precoded entries, to obtain 2N intermediate entries; and taking a conjugate of one half of the 2N intermediate entries, and keeping the other half unchanged, to obtain the 2N precoding results.

With reference to any one of the first aspect or the foregoing implementation manner of the first aspect, in another implementation manner of the first aspect, the taking a conjugate of one half of the 2N information symbols includes: determining N target carriers from the 2N carriers, where the target carriers meet the following condition: after undergoing compressive sampling performed by the compressive sampling receiving device, information symbols located on the target carriers are taken a conjugate of; and taking a conjugate of the information symbols that are in the 2N information symbols and are located on the N target carriers.

With reference to any one of the first aspect or the foregoing implementation manner of the first aspect, in another implementation manner of the first aspect, the taking a conjugate of one half of the 2N intermediate entries includes: taking a conjugate of intermediate entries that are in the 2N intermediate entries and are converted from the information symbols on the N target carriers.

With reference to any one of the first aspect or the foregoing implementation manner of the first aspect, in another implementation manner of the first aspect, the separately transmitting the 2N precoding results to the compressive sampling receiving device by using the 2N carriers includes: separately transmitting the 2N precoding results to the compressive sampling receiving device by using the 2N carriers, where a precoding result transmitted by using each carrier is converted from an information symbol located on the carrier.

With reference to any one of the first aspect or the foregoing implementation manners of the first aspect, in another implementation manner of the first aspect, the obtaining a periodic pseudo random sequence used when a compressive sampling receiving device performs frequency mixing includes: receiving signaling sent by the compressive sampling receiving device, where the signaling is used to indicate a serial number of the periodic pseudo random sequence; and obtaining, from a prestored periodic pseudo random sequence set according to the signaling, the periodic pseudo random sequence corresponding to the serial number.

With reference to any one of the first aspect or the foregoing implementation manners of the first aspect, in another implementation manner of the first aspect, the selecting 2N information symbols from N radio signals includes: selecting the 2N carriers from the N narrow bands according to a frequency $f_p$ of the periodic pseudo random sequence, where the 2N carriers meet the following condition: after the frequency mixing is performed, the spectrums on the 2N carriers are shifted to the same frequency band in a frequency mixing interval $[-f_p/2, +f_p/2]$; and selecting the information symbols on the 2N carriers as the 2N information symbols.

With reference to any one of the first aspect or the foregoing implementation manners of the first aspect, in another implementation manner of the first aspect, the columns corresponding to the N narrow bands are columns that are in the matrix A and that have same Numbers as nonzero rows in a matrix Z, the matrix Z meets: Y=AZ, and the matrix Y is a received signal matrix corresponding to the N radio signals.

With reference to any one of the first aspect or the foregoing implementation manners of the first aspect, in another implementation manner of the first aspect, each radio signal in the N radio signals is a signal that occupies a preset continuous frequency band.

With reference to any one of the first aspect or the foregoing implementation manners of the first aspect, in another implementation manner of the first aspect, the radio signals are OFDM signals, the narrow bands are subbands, the information symbols are OFDM symbols, and the carriers are subcarriers.

According to a second aspect, a signal processing method is provided. The method includes obtaining, by a compressive sampling receiving device, a received signal matrix Y; determining a received matrix $\overline{S}^H$ according to a periodic pseudo random sequence used by the compressive sampling receiving device, where a conjugate transpose matrix $\overline{S}$ of $\overline{S}^H$ meets a singular value decomposition formula $A_s = \overline{SVD}^H$, the matrix A includes columns that are in an equivalent channel matrix A and that have same Numbers as nonzero rows in a matrix Z, the matrix Z meets: Y=AZ, and the matrix A is generated based on the periodic pseudo random sequence; and multiplying the matrix $\overline{S}^H$ by the matrix Y, so as to restore a signal based on a multiplication result.

With reference to the second aspect, in an implementation manner of the second aspect, before the obtaining, by a compressive sampling receiving device, a received signal matrix Y, the method further includes: sending signaling to a transmitter, where the signaling is used to indicate a serial number of the periodic pseudo random sequence, the serial number is preset, and the serial number is used by the transmitter to obtain the periodic pseudo random sequence from a prestored periodic pseudo random sequence set according to the serial number.

According to a third aspect, a transmitter is provided. The transmitter includes an obtaining unit, configured to obtain a periodic pseudo random sequence used when a compressive sampling receiving device performs frequency mixing; a selection unit, configured to select 2N information symbols from N radio signals, where the N radio signals are separately located on N narrow bands, the 2N information symbols are separately located on 2N carriers on the N narrow bands, and spectrums of the information symbols on the 2N carriers are shifted to a same frequency band after the frequency mixing is performed. The transmitter also includes a determining unit, configured to determine a precoding matrix $\overline{D}$ according to the periodic pseudo random sequence, where a conjugate transpose matrix $\overline{D}^H$ of the matrix $\overline{D}$ meets a singular value decomposition formula $A_s = \overline{SVD}^H$, the matrix A is a matrix including columns that are corresponding to the N narrow bands and are in an equivalent channel matrix A, and the matrix A is generated based on the periodic pseudo random sequence. The transmitter also includes a precoding unit, configured to use the precoding matrix determined by the determining unit to perform precoding processing on the 2N information symbols, to obtain 2N precoding results. The transmitter also includes a transmission unit, configured to separately transmit, by using the 2N carriers, the 2N precoding results obtained by the precoding unit to the compressive sampling receiving device.

With reference to the third aspect, in an implementation manner of the third aspect, the precoding unit is specifically configured to: take a conjugate of one half of the 2N information symbols, and keep the other half unchanged, to obtain 2N to-be-precoded entries; multiply the precoding matrix by a column vector that includes the 2N to-be-precoded entries, to obtain 2N intermediate entries; and take a conjugate of one half of the 2N intermediate entries, and keep the other half unchanged, to obtain the 2N precoding results.

With reference to any one of the third aspect or the foregoing implementation manner of the third aspect, in another implementation manner of the third aspect, the precoding unit is specifically configured to: determine N target carriers from the 2N carriers, where the target carriers meet the following condition: after undergoing compressive sampling performed by the compressive sampling receiving device, information symbols located on the target carriers are taken a conjugate of; and take a conjugate of the information symbols that are in the 2N information symbols and are located on the N target carriers.

With reference to any one of the third aspect or the foregoing implementation manner of the third aspect, in another implementation manner of the third aspect, the precoding unit is specifically configured to take a conjugate of intermediate entries that are in the 2N intermediate entries and are converted from the information symbols on the N target carriers.

With reference to any one of the third aspect or the foregoing implementation manner of the third aspect, in another implementation manner of the third aspect, the transmission unit is specifically configured to separately transmit the 2N precoding results to the compressive sampling receiving device by using the 2N carriers, where a precoding result transmitted by using each carrier is converted from an information symbol located on the carrier.

With reference to any one of the third aspect or the foregoing implementation manners of the third aspect, in another implementation manner of the third aspect, the obtaining unit is specifically configured to: receive signaling sent by the compressive sampling receiving device, where the signaling is used to indicate a serial number of the periodic pseudo random sequence; and obtain, from a prestored periodic pseudo random sequence set according to the signaling, the periodic pseudo random sequence corresponding to the serial number.

With reference to any one of the third aspect or the foregoing implementation manners of the third aspect, in another implementation manner of the third aspect, the selection unit is specifically configured to: select the 2N carriers from the N narrow bands according to a frequency $f_p$ of the periodic pseudo random sequence, where the 2N carriers meet the following condition: after the frequency mixing is performed, the spectrums on the 2N carriers are shifted to the same frequency band in a frequency mixing interval $[-f_p/2, +f_p/2]$; and select the information symbols on the 2N carriers as the 2N information symbols.

With reference to any one of the third aspect or the foregoing implementation manners of the third aspect, in another implementation manner of the third aspect, the columns corresponding to the N narrow bands are columns that are in the matrix A and that have same Numbers as nonzero rows in a matrix Z, the matrix Z meets: Y=AZ, and the matrix Y is a received signal matrix corresponding to the N radio signals.

With reference to any one of the third aspect or the foregoing implementation manners of the third aspect, in another implementation manner of the third aspect, each radio signal in the N radio signals is a signal that occupies a preset continuous frequency band.

With reference to any one of the third aspect or the foregoing implementation manners of the third aspect, in another implementation manner of the third aspect, the radio signals are OFDM signals, the narrow bands are subbands, the information symbols are OFDM symbols, and the carriers are subcarriers.

According to a fourth aspect, a compressive sampling receiving device is provided, including: an obtaining unit, configured to obtain a received signal matrix Y; a determining unit, configured to determine a received matrix $\overline{S}^H$ according to a periodic pseudo random sequence used by the compressive sampling receiving device, where a conjugate transpose matrix $\overline{S}$ of $\overline{S}^H$ meets a singular value decomposition formula $A_s=\overline{S}V\overline{D}^H$, the matrix $A_s$ includes columns that are in an equivalent channel matrix A and that have same Numbers as nonzero rows in a matrix Z, the matrix Z meets: Y=AZ, and the matrix A is generated based on the periodic pseudo random sequence; and an arithmetic unit, configured to multiply the matrix $\overline{S}^H$ determined by the determining unit by the matrix Y obtained by the obtaining unit, so as to restore a signal based on a multiplication result.

With reference to the fourth aspect, in an implementation manner of the fourth aspect, the compressive sampling receiving device further includes: a sending unit, configured to send signaling to a transmitter, where the signaling is used to indicate a serial number of each periodic pseudo random sequence in the periodic pseudo random sequence, the serial number of each periodic pseudo random sequence is preset, and the serial number is used by the transmitter to obtain the periodic pseudo random sequence from a prestored periodic pseudo random sequence set according to the serial number.

Because selected 2N information symbols are shifted to a same frequency band at a compressive sampling compressive sampling receiving device, if the 2N information symbols are transmitted directly, a corresponding received vector y at the compressive sampling receiving device meets $y=A_s z$, z is a column vector converted from the 2N information symbols. Because each entry in the matrix $A_s$ is a nonzero entry, interference occurs between the 2N information symbols inevitably. In the embodiments of the present invention, a precoding matrix $\overline{D}$ is generated according to a periodic pseudo random sequence used by the compressive sampling receiving device, and 2N precoding results obtained after processing by using the precoding matrix $\overline{D}$ are transmitted to the compressive sampling receiving device. Because the received vector y at the compressive sampling receiving device meets $y=A_s\overline{D}z$, which is further expanded to $y=\overline{S}Vz$, when a compressive sampling receiving device left-multiplies $\overline{S}^H$ by the vector y, a final received vector y' obtained meets $y'=Vz$. Because V is a diagonal matrix in singular value decomposition, orthogonality is met between the 2N information symbols, thereby avoiding mutual interference and increasing an SINR of a received signal.

BRIEF DESCRIPTION OF THE DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

FIG. 5 is a schematic diagram of a frequency domain model at a compressive sampling receiving device;

FIG. 8 is a schematic diagram of a frequency domain model at a compressive sampling receiving device when a transmit end transmits the narrowband signal shown in FIG. 6;

FIG. 9 is a schematic diagram of an equivalent model of the frequency domain model in FIG. 8;

DETAILED DESCRIPTION OF ILLUSTRATIVE EMBODIMENTS

The following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

First, in order to more clearly describe implementation manners of the present invention, an existing MWC system and problems thereof are briefly described with reference to FIG. 1 to FIG. 5.

The system uses a spread spectrum technology in a communications theory. The system has an analog frequency mixing front end, and the analog frequency mixing front end aliases spectrums so that a spectrum of each frequency band appears on a baseband. The system includes multiple channels, and different aliasing is performed on the multiple channels. Therefore, in principle, relatively sparse multi-band signals can be restored by means of a sufficient quantity of aliasing.

Figure 1:
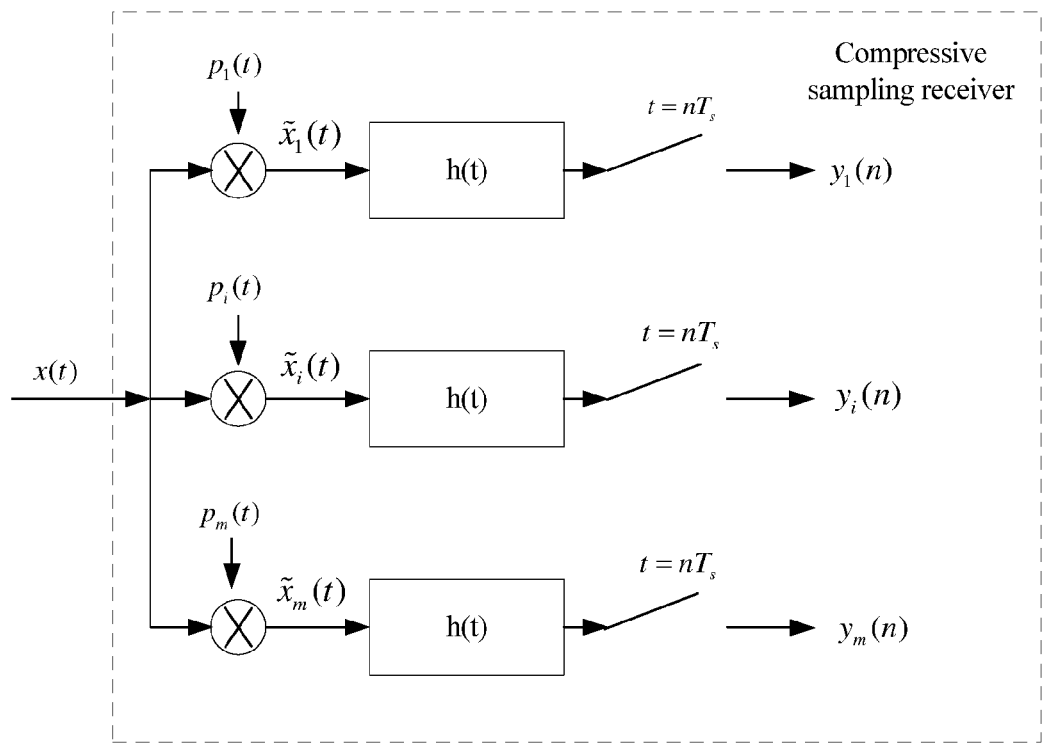
FIG. 1 is an exemplary diagram of an existing compressive sampling receiving device.

More specifically, referring to FIG. 1, a signal x(t) is input into m channels of a compressive sampling receiving device simultaneously. On the $i^{th}$ channel, x(t) is multiplied by a frequency mixing function $p_i(t)$. Actually, $p_i(t)$ is a periodic pseudo random sequence whose period is $T_p$. After frequency mixing, a signal spectrum is truncated by a low-pass filter. A truncation frequency of the low-pass filter is $1/(2T_s)$, and a signal obtained after filtering is sampled at a frequency of $1/T_s$. A sampling frequency of each sampling channel may be set to be quite low so that an existing commercial ADC can complete the sampling task. Parameters that need to be designed in the system include: a quantity m of channels, the period $T_p$, the sampling frequency $1/T_s$, and the frequency mixing function $p_i(t)$ when $1 \le i \le m$.

For the purpose of more specific description, $p_i(t)$ is selected as a piecewise constant function in the following. The function changes between +1 and −1 in M equal time intervals. For details, refer to FIG. 2. A specific form of the function is shown in the following formula:

$$p_i(t) = \alpha_{ik}, k\frac{T_p}{M} \le t \le (k+1)\frac{T_p}{M}, 0 \le k \le M-1, \qquad (1)$$

where $\alpha_{ik} \in \{+1, -1\}$, $p_i(t+nT_p) = p_i(t)$, and n is an integer. It should be noted that, $p_i(t)$ only needs to be periodic in principle; therefore, $p_i(t)$ is not limited to the foregoing form and may have another option.

The following analyzes a signal processing manner of the foregoing system from a perspective of a frequency domain.

First, a relationship between the unknown signal x(t) and a sampling sequence $y_i[n]$ obtained by means of compressive sampling is deduced. First, the following formulas are introduced:

$$f_p = 1/T_p, F_p = [-f_p/2, +f_p/2] \qquad (2a)$$

$$f_s = 1/T_s, F_s = [-f_s/2, +f_s/2] \qquad (2b)$$

In consideration of the $i^{th}$ channel, because $p_i(t)$ uses $T_p$ as the period, Fourier expansion of $p_i(t)$ is as follows:

$$p_i(t) = \sum_{l=-\infty}^{\infty} c_{il} e^{j\frac{2\pi}{T_p}lt}, \text{ where} \qquad (3)$$

$$c_{il} = \frac{1}{T_p}\int_0^{T_p} p_i(t) e^{-j\frac{2\pi}{T_p}lt} dt \qquad (4)$$

A Fourier transform result of an analog signal $\tilde{x}_i(t) = x(t) p_i(t)$ obtained by multiplication is:

$$\tilde{X}_i(f) = \int_{-\infty}^{\infty} \tilde{x}_i(t) e^{-j2\pi ft} dt \qquad (5)$$

$$= \int_{-\infty}^{\infty} x(t) \left( \sum_{l=-\infty}^{\infty} c_{il} e^{j\frac{2\pi}{T_p}lt} \right) e^{-j2\pi ft} dt$$

$$= \sum_{l=-\infty}^{\infty} c_{il} \int_{-\infty}^{\infty} x(t) e^{-j2\pi\left(f - \frac{l}{T_p}\right)t} dt$$

$$= \sum_{l=-\infty}^{\infty} c_{il} X(f - lf_p)$$

Figure 3:
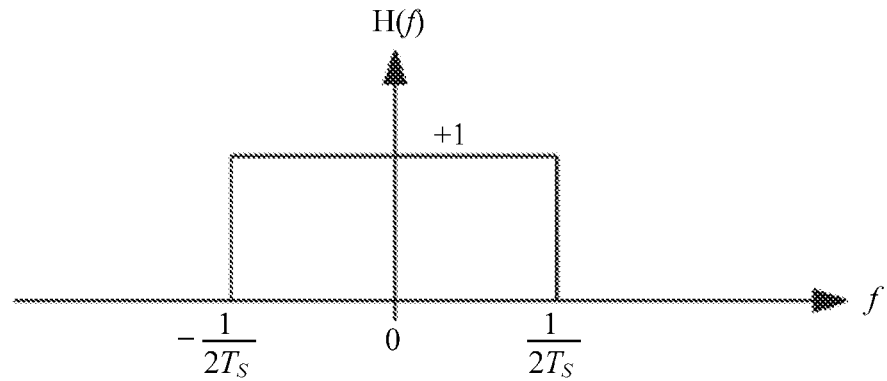
FIG. 3 is an exemplary diagram of a specific form of a filter H(f)

Therefore, input of H(f) (a representation of h(t) in the frequency domain) is a linear combination of signals obtained after X(f) is translated on a per $f_p$ basis. When $f \notin F$, X(f)=0. Therefore, a sum calculated from formula (5)

includes (a maximum of) $\lceil f_{NYQ}/f_p \rceil$ nonzero entries. $f_{NYQ}$ is a Nyquist sampling frequency of an entire bandwidth The filter H(f) uses a frequency response of an ideal rectangular function, as shown in FIG. 3. Therefore, only frequencies in the $F_s$ interval are included in the uniform sequence $y_i[n]$. Therefore, a discrete time Fourier transform (DTFT) of the $i^{th}$ sequence $y_i[n]$ may be expressed as follows:

$$Y_i(e^{j2\pi fT_s}) = \sum_{n=-\infty}^{\infty} y_i[n] e^{-j2\pi fnT_s} \qquad (6)$$

$$= \sum_{l=L_0}^{+L_0} c_{il} X(f - lf_p), f \in F_s,$$

where $F_s$ is defined in formula (2b), and a minimum integer is selected as $L_0$, so that in the $F_s$ interval, a sum calculated in the foregoing formula includes all nonzero components of X(f). An accurate value of $L_0$ may be obtained by means of calculation by using the following formula:

$$-\frac{f_s}{2} + (L_0+1)f_p \geq \frac{f_{NYQ}}{2} \rightarrow L_0 = \left\lceil \frac{f_{NYQ}+f_s}{2f_p} \right\rceil - 1 \qquad (7)$$

It should be noted that output $\tilde{x}_i(t)$ of a frequency mixer is not limited by a frequency band, but in theory, depends on a coefficient $c_{i1}$, as defined in the Fourier transform formula (5). Because output of the filter includes only a limited quantity of times of aliasing of x(t), the output may be calculated by using formula (6).

Relational expression (6) associates the DTFT result $y_i[n]$ with unknown X(f). The formula is a key to restoring x(t). For simplicity, formula (6) is rewritten in a matrix form as follows:

$$y(f) = Az(f), f \in F_s \qquad (8), \text{ where}$$

y(f) is a vector in a length of m, and the $i^{th}$ element of y(f) is $y_i(f) = y_i(e^{j2\pi fT_s})$. It should be noted that herein, A is an equivalent channel matrix A in this embodiment of the present invention, and each row of a vector z(f) represents a spectrum in the frequency domain. The spectrum may be discretely sampled to obtain an information symbol; therefore, z(f) may be corresponding to a matrix Z in this embodiment of the present invention. The two are essentially the same. The following describes in detail specific forms of the matrix A and the vector z(f). A length of unknown $z(f) = [z_1(f), \ldots, z_L(f)]^T$ is:

$$L = 2L_0 + 1 \qquad (9), \text{ where}$$

$$z_i(f) = X(f+(i-L_0-1)f_p), 1 \leq i \leq L, f \in F_s \qquad (10)$$

Figure 4:
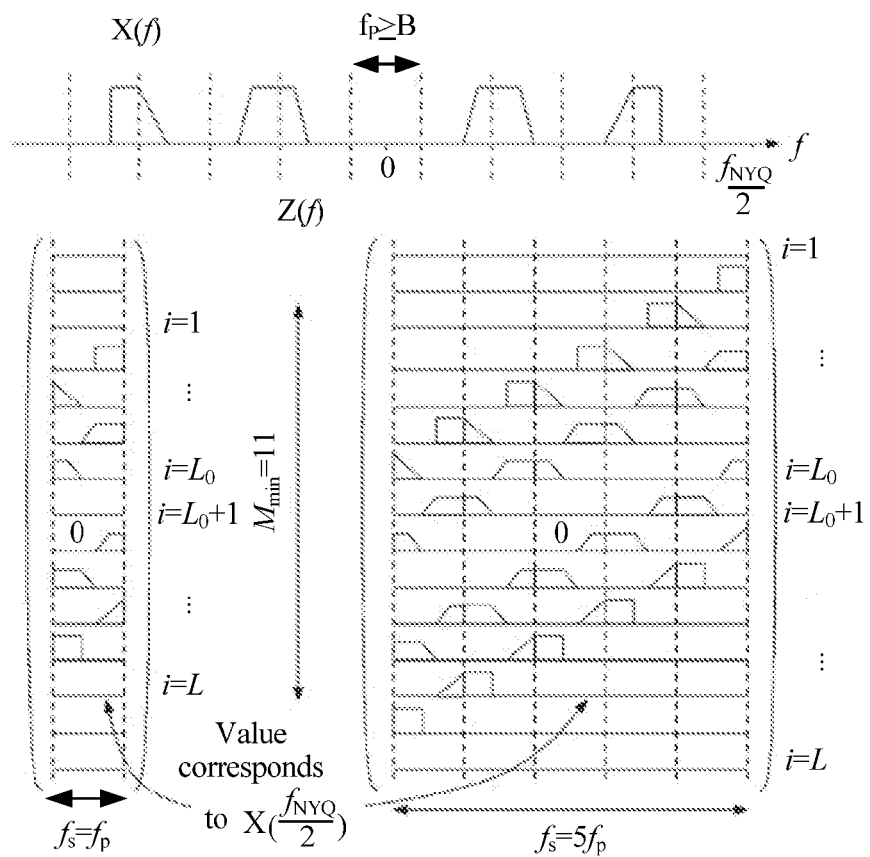
FIG. 4 is a schematic diagram of a spectrum shift process.

The matrix A of m×L includes the coefficient $c_{i1}$.

$$A_{i1} = c_{i,-1} = c_{i1}^* \qquad (11), \text{ where}$$

the reversed order depends on enumeration of $z_i(f)$ in formula (10). In FIG. 4, an example in which N is four frequency bands, a shift frequency is $f_p = 1/T_p \geq B$, and there are two sampling rates $f_p = f_s$ and $f_s = 5f_p$ is used to describe z(f) and a copy obtained after X(f) is shifted on the per $f_p$ basis. In FIG. 4, on a left plane, $f_s = f_p$, and therefore, a length of z(f) is L=11; on a right plane, $f_s = 5f_p$, and therefore, L=15. A copy that is of X(f) and is obtained after X(f) is shifted to a right side (or a left side) of a frequency axis is included in a location of an entry corresponding to $i \leq L_0$ (or $i > L_0 + 1$). No shift occurs in an intermediate entry, that is, at $i = L_0 + 1$. Each entry in z(f) represents one segment of the frequency X(f), and has a length of $f_s$. Therefore, only z(f) needs to be determined in an interval $f \in F_p$ for restoring x(t).

In the current analysis, the periodic function $p_i(t)$ that uses $T_p$ as the period may be selected randomly. Before further description, a role of each parameter is described. When shift of X(f) is determined by $T_p$, an interval of each time of shift is $f_p = 1/T_p$. Likewise, the shift frequency $f_p$ controls layout of frequency band segments z(f), as shown in FIG. 4. $f_p \geq B$ may be selected so that each frequency band includes only one nonzero element (relative to specific f) of z(f). Therefore, z(f) includes a maximum of N nonzero elements. Actually, $f_p$ may be slightly greater than B to avoid an edge effect. Therefore, the parameter $T_p$ is used to convert multi-band $x(t) \in M$ into a range beforehand according to sparseness of z(f). A sampling frequency $f_s$ of a single channel is set to be in the frequency range $F_s$, as shown in formula (6). From FIG. 4, it can be clearly learned that for each $f \in F_p$, provided that $f_s \geq f_p$, restoring x(t) from the sampling sequence $y_i[n]$ is equivalent to restoring z(f) from y(f). An overall sampling rate $mf_s$ of the system is decided by the quantity m of channels. For utmost simplicity, $f_s = f_p \square B$ may be set so that resolution of the sampling rate is controlled to be $f_p$ as shown on the left plane of FIG. 4. From formula (7) and formula (9), it can be learned that L is decided by settings of $f_s$ and $f_p$. L is a quantity of frequency segments that may include energy in z(f) for specific $x(t) \in M$.

A role of the frequency mixing function is implied in formula (8), and is reflected by the coefficient $c_{i1}$. Each $p_i(t)$ provides one row in the matrix A. Roughly, in the period $T_p$, $p_i(t)$ should have many time segments, so that the Fourier expansion formula (3) includes more than L main entries. In this case, the channel output $y_i[n]$ is a mixture of all spectrum segments (not all zeros) in z(f). Functions $p_i(t)$ should be different from each other to ensure linear independence between rows in the matrix A. The following describes specific selection of $p_i(t)$, that is, specific selection of a symbol waveform.

Figure 2:
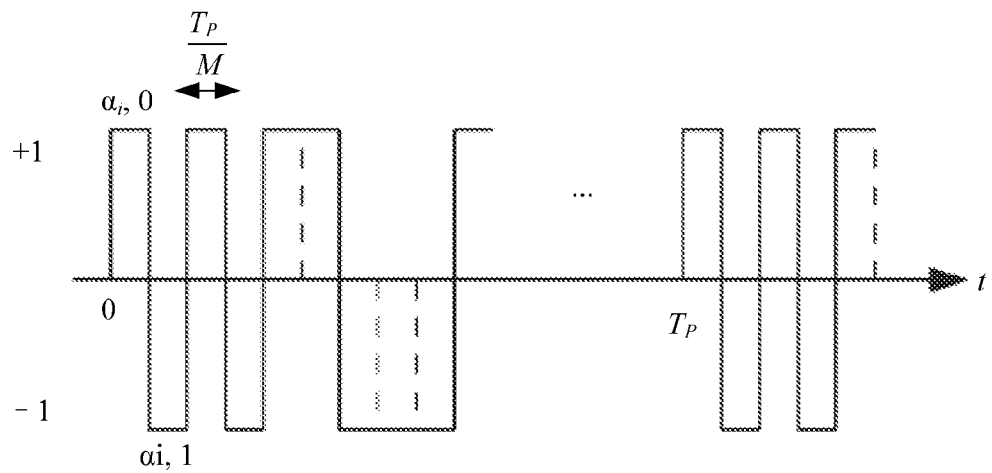
FIG. 2 is an exemplary diagram of a specific form of $p_i(t)$.

In consideration of the symbol varying function $p_i(t)$ shown in FIG. 2, the coefficient $c_{i1}$ is shown as follows:

$$c_{il} = \frac{1}{T_p} \int_0^{T_p} \sum_{k=0}^{M-1} \alpha_{ik} e^{-j\frac{2\pi}{T_p}l\left(t+k\frac{T_p}{M}\right)} dt \qquad (12)$$

$$= \frac{1}{T_p} \sum_{k=0}^{M-1} \alpha_{ik} e^{-j\frac{2\pi}{M}lk} \int_0^{\frac{T_p}{M}} e^{-j\frac{2\pi}{T_p}l} dt$$

An integral is calculated to obtain:

$$dl = \frac{1}{T_p} \int_0^{\frac{T_p}{M}} e^{-j\frac{2\pi}{T_p}l} dt \qquad (13)$$

$$= \begin{cases} \frac{1}{M}, & l = 0 \\ \frac{1-\theta^l}{2j\pi l}, & l \neq 0 \end{cases},$$

where
$\theta = e^{-j2\pi/M}$, and therefore $$c_{il} = dl \sum_{k=0}^{M-1} \alpha_{ik} \theta^{lk} \qquad (14)$$

It is assumed that F is a discrete Fourier transform matrix of M×M. The $i^{th}$ column in the matrix is:

$$\overline{F}_i=[\theta^{0-i},\theta^{1-i},\ldots,\theta^{(M-1)-i}]^T \qquad (15)$$

where $0 \le i \le M-1$. It is assumed that F is an M×L matrix, and has columns $[\overline{F}_{L_0}, \ldots, \overline{F}_{-L_0}]$. $[\overline{F}_{L_0}, \ldots, \overline{F}_{-L_0}]$ is a column subset obtained after re-permutation of F. It should be noted that for M=L, F is a unit matrix. Subsequently, formula (8) may be rewritten into:

$$y(f)=SFDz(f), f\in F_s \qquad (16)$$

where

S is a symbol matrix of m×M, $S_{ik}=\alpha_{ik}$, $D=\text{diag}(d_{L_0}, \ldots, d_{-L_0})$ is an L×L diagonal matrix, and $d_l$ is defined in formula (13). As shown in formula (11), the reversed order depends on enumeration of $z_i(f)$ in formula (10). A correlation of a symbol style $\{\alpha_{ik}\}$ is further expanded into a mathematical relationship shown in FIG. 5.

Important parameters such as the equivalent channel matrix A, the matrix Z (that is, z(f)), and the period and the specific form of the frequency mixing function $p_i(t)$ (actually a periodic pseudo random sequence) in the existing compressive sampling system (that is, the foregoing MWC system) are described in detail above. For ease of understanding, the following uses an example to describe problems that exist in the existing compressive sampling system.

Figure 6:
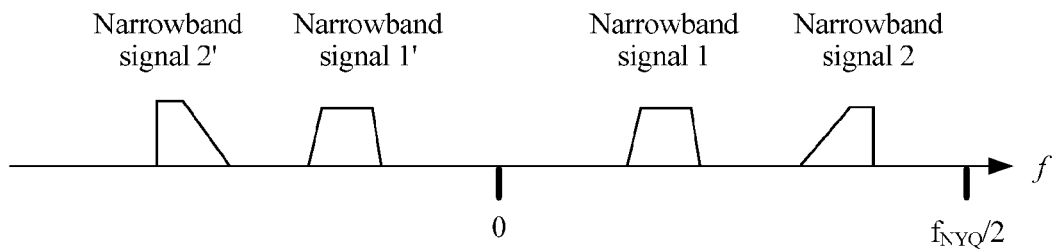
FIG. 6 is an exemplary diagram of a to-be-transmitted narrowband signal.

FIG. 6 is an exemplary diagram of a to-be-transmitted narrowband signal. It is assumed that a to-be-transmitted signal is x(t), and includes two narrowband signals shown in FIG. 6: a narrowband signal 1 and a narrowband signal 2 (a narrowband signal 1' and a narrowband signal 2' are negative-frequency narrowband signals separately corresponding to the narrowband signal 1 and the narrowband signal 2). It is assumed that a bandwidth of each narrowband signal is B=50 MHz, and a center frequency of each narrowband signal changes within a range [0+B/2, 5 GHz-B/2], and it is also assumed that a Nyquist sampling frequency is $f_{NYQ}$=10 GHz.

After being transmitted at a transmit end, the foregoing x(t) is transmitted through a channel and received by a compressive sampling receiving device. m sampling channels are set on the compressive sampling receiving device to perform m-channel parallel processing on the received signal. For a specific form of the compressive sampling receiving device, reference may be made to FIG. 1. Details are already described above and are not described herein.

The $i^{th}$ sampling channel is used as an example for description. A periodic change frequency of a periodic pseudo random sequence $p_i(t)$ may be set to $f_p$=51.3 MHz, and is slightly greater than the bandwidth B of the narrowband signal. For a specific form of $p_i(t)$, refer to formula (3) and formula (4) above. Details are not described herein. Correspondingly, a sampling frequency of a low-rate ADC may be set to $f_s=f_p$, and a bandwidth of a low-pass filter h(t) may be set to $[-f_s/2, f_s/2]$. When the signal x(t) received by the compressive sampling receiving device passes through the $i^{th}$ channel, frequency mixing processing is performed first by using the periodic pseudo random sequence $p_i(t)$, that is, $p_i(t)$ is multiplied by the received signal x(t) to obtain $\tilde{x}_i(t)$, that is, $\tilde{x}_i(t)=x(t) p_i(t)$. Then the low-pass filter h(t) and the low-rate ADC (indicated by $t=nT_s$ in FIG. 1) are sequentially used to obtain a sampling sequence $y_i(n)$, where n=1, 2, ..., and Num_sample, and Num_sample is a sampling quantity. Then the original signal x(t) is reconstructed by means of digital signal processing (DSP) on the basis of a sampling sequence obtained on each sampling channel.

Figure 7:
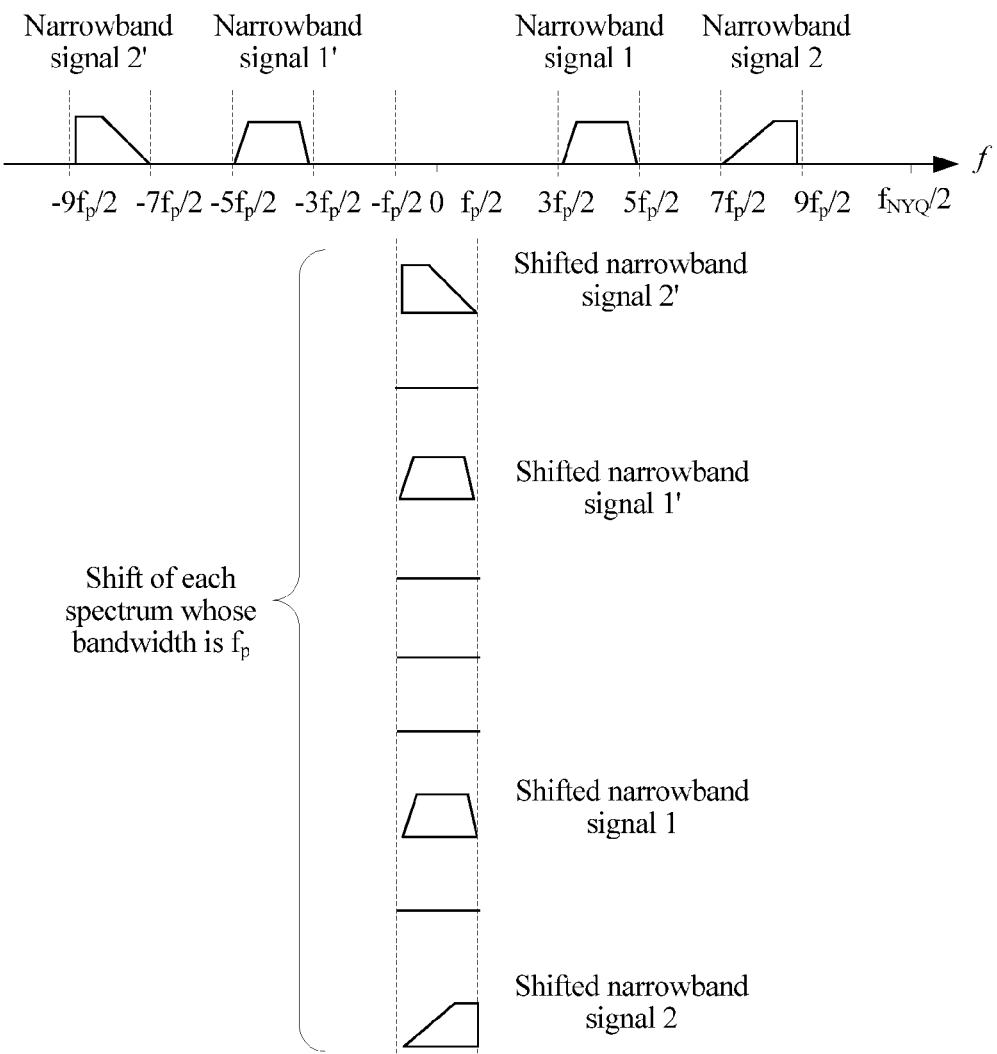
FIG. 7 is a spectrum shift diagram corresponding to the narrowband signal in FIG. 6.

At a compressive sampling receiving device, as described above, the periodic pseudo random sequence $p_i(t)$ is multiplied by x(t), which has a spectrum shift role. FIG. 7 shows a result after spectrum shift is performed on the narrowband signals in FIG. 6, and FIG. 8 provides a mathematical model of a received signal in a frequency domain when the compressive sampling receiving device uses a spectrum shift manner shown in FIG. 7. For construction of the mathematical model, refer to descriptions about formula (8) above. In FIG. 8, A is an equivalent channel matrix, and specifically, A=SFD. The $i^{th}$ row in S is a value of a period of $p_i(t)$, F is a discrete Fourier transform (DFT) matrix, D is a diagonal matrix, and a value of each entry may be regarded as a constant. For meanings and forms of matrices S, F, and D, refer to the foregoing descriptions, especially descriptions about formula (11) and formula (16) above. $y_i^H(f)$ is a result of transforming the sampling sequence $y_i(n)$ on the $i^{th}$ channel to the frequency domain. A specific form of a matrix Z in FIG. 8 is related to the period of the periodic pseudo random sequence. Refer to a related deduction process of formula (10).

From FIG. 8, it can be learned that signals are absent on narrow bands other than four narrow bands (including the two negative-frequency narrow bands), and the narrow bands on which signals are absent are indicated by a horizontal line. That is, a row that is in the matrix Z and is corresponding to the horizontal line is a zero entry. A matrix Y in FIG. 8 is transformed to obtain a matrix $A_s$ by retaining columns that are in the matrix A and that have same Numbers as nonzero entries in the matrix Z, and an equation in FIG. 8 may be converted into FIG. 9. For example, assuming that the $1^{st}$, $3^{rd}$, $6^{th}$, and $8^{th}$ rows in the matrix Z include nonzero elements, the $1^{st}$, $3^{rd}$, $6^{th}$, and $8^{th}$ columns in the matrix A may be retained to form the matrix $A_s$.

From FIG. 9, it can be learned that, from a perspective of the compressive sampling receiving device, spectrums of the four narrowband signals are shifted to a same frequency band, that is, $[-f_p/2, f_p/2]$ in FIG. 7, near a baseband after compressive sampling processing is performed at the compressive sampling receiving device. In other words, the spectrums of the four narrowband signals (including the two negative-frequency narrowband signals) are aliased. The aliased narrowband signals interfere with each other, and an SINR of a received signal is low.

The following describes in detail a signal processing method in an embodiment of the present invention with reference to the accompanying drawings.

For ease of understanding, on the basis of FIG. 9, an overall design conception of this embodiment of the present invention is briefly described first by using examples.

Assuming that the narrowband signal 1 and the narrowband signal 2 are denoted by c and d respectively, when each narrowband signal is modulated by means of orthogonal frequency division multiplexing (OFDM), c and d each include 101 subcarriers. During implementation, four high-frequency subcarriers ($\pm 50\omega$, $\pm 49\omega$) may be removed. That is, no information symbol is transmitted on the four high-frequency subcarriers. It is well known that a matrix Z' that represents the foregoing four narrowband signals may be indicated by using sampling values of the four narrowband signals as follows:

$$Z' = \begin{bmatrix} d_{48}^* & \cdots & d_1^* & d_0^* & d_{-1}^* & \cdots & d_{-48}^* \\ c_{48}^* & \cdots & c_1^* & c_0^* & c_{-1}^* & \cdots & c_{-48}^* \\ c_{-48} & \cdots & c_{-1} & c_0 & c_1 & \cdots & c_{48} \\ d_{-48} & \cdots & d_{-1} & d_0 & d_1 & \cdots & d_{48} \end{bmatrix} \qquad (17)$$

Correspondingly, the expression in FIG. 9 may be expressed as follows:

$$Y = \begin{bmatrix} y_1^H(f) \\ y_2^H(f) \\ \vdots \\ y_m^H(f) \end{bmatrix} = A_s \begin{bmatrix} d_{48}^* & \cdots & d_1^* & d_0^* & d_{-1}^* & \cdots & d_{-48}^* \\ c_{48}^* & \cdots & c_1^* & c_0^* & c_{-1}^* & \cdots & c_{-48}^* \\ c_{-48} & \cdots & c_{-1} & c_0 & c_1 & \cdots & c_{48} \\ d_{-48} & \cdots & d_{-1} & d_0 & d_1 & \cdots & d_{48} \end{bmatrix} \quad (18)$$

Specifically, in the prior art, a transmit end directly transmits $$\begin{bmatrix} d_{-k} \\ c_{-k} \\ c_k \\ d_k \end{bmatrix}.$$

OFDM symbols $c_k$ and $c_{-k}$ are respectively located on the $k^{th}$ subcarrier and the $-k^{th}$ subcarrier of the narrowband signal 1; and OFDM symbols $d_k$ and $d_{-k}$ are respectively located on the $k^{th}$ subcarrier and the $-k^{th}$ subcarrier of the narrowband signal 2. After information symbols on the foregoing four subcarriers are transmitted to a compressive sampling receiving device and undergo m-channel parallel processing performed by a compressive sampling receiving device, an obtained received signal matrix is shown in the following formula:

$$y_k = A_s \begin{bmatrix} d_{-k}^* \\ c_{-k}^* \\ c_k \\ d_k \end{bmatrix} \quad (19)$$

It should be noted that at the compressive sampling receiving device, $d_{-k}$ and $c_{-k}$ are taken a conjugate of (* is a conjugate operator), which is a characteristic of the compressive sampling receiving device. From formula (19), it is not difficult to learn that how to avoid interference between $d_{-k}^*$, $c_{-k}^*$, $c_k$, and $d_k$ is a primary problem to be resolved in this embodiment of the present invention. First, the following may be obtained by performing singular value decomposition on $A_s$:

$$A_s = \overline{S}\overline{V}\overline{D}^H \quad (20)$$

Then precoding processing is performed on the information symbols transmitted at the transmit end, so that $$\begin{bmatrix} \overline{d}_{-k} \\ \overline{c}_{-k} \\ \overline{c}_k \\ \overline{d}_k \end{bmatrix}$$

are transmitted instead. Due to the conjugate-taking characteristic of the compressive sampling receiving device, the following is received at the compressive sampling receiving device:

$$y_k = A_s \begin{bmatrix} \overline{d}_{-k}^* \\ \overline{c}_{-k}^* \\ \overline{c}_k \\ \overline{d}_k \end{bmatrix} + w \quad (21)$$

If $$\begin{bmatrix} \overline{d}_{-k}^* \\ \overline{c}_{-k}^* \\ \overline{c}_k \\ \overline{d}_k \end{bmatrix} = \overline{D} \begin{bmatrix} d_{-k}^* \\ c_{-k}^* \\ c_k \\ d_k \end{bmatrix}$$

is met and $\overline{D}^H$ counteracts $\overline{D}$, formula (21) may be rewritten into:

$$y_k = A_s \overline{D} \begin{bmatrix} d_{-k}^* \\ c_{-k}^* \\ c_k \\ d_k \end{bmatrix} = \overline{S}\overline{V} \begin{bmatrix} d_{-k}^* \\ c_{-k}^* \\ c_k \\ d_k \end{bmatrix} \quad (22)$$

Then, after obtaining $y_k$, the compressive sampling receiving device left-multiplies $y_k$ by $\overline{S}^H$. $\overline{S}^H$ counteracts $\overline{S}$ to obtain the following formula:

$$\overline{S}^H y_k = \overline{V} \begin{bmatrix} d_{-k}^* \\ c_{-k}^* \\ c_k \\ d_k \end{bmatrix} \quad (23)$$

From formula (23), it can be learned that because a matrix $\overline{V}$ in singular value decomposition is a diagonal matrix, orthogonality is kept between $d_{-k}^*$, $c_{-k}^*$, $c_k$, and $d_k$, so that mutual interference between each other can be avoided.

A current problem is how to design $$\begin{bmatrix} \overline{d}_{-k} \\ \overline{c}_{-k} \\ \overline{c}_k \\ \overline{d}_k \end{bmatrix},$$

so that $$\begin{bmatrix} \overline{d}_{-k} \\ \overline{c}_{-k} \\ \overline{c}_k \\ \overline{d}_k \end{bmatrix}$$

meet:

$$\begin{bmatrix} \overline{d}_{-k}^* \\ \overline{c}_{-k}^* \\ \overline{c}_k \\ \overline{d}_k \end{bmatrix} = \overline{D} \begin{bmatrix} d_{-k}^* \\ c_{-k}^* \\ c_k \\ d_k \end{bmatrix} \quad (24)$$

Principles are as follows:

First, $d_{-k}$ and $c_{-k}$ in the to-be-transmitted OFDM symbols $$\begin{bmatrix} d_{-k} \\ c_{-k} \\ c_k \\ d_k \end{bmatrix}$$

on the four subcarriers are taken a conjugate of to obtain $$\begin{bmatrix} d^*_{-k} \\ c^*_{-k} \\ c_k \\ d_k \end{bmatrix}.$$

Then $$\begin{bmatrix} d^*_{-k} \\ c^*_{-k} \\ c_k \\ d_k \end{bmatrix}$$

are multiplied by the precoding matrix $\overline{D}$:

$$\begin{bmatrix} \tilde{d}_{-k} \\ \tilde{c}_{-k} \\ \tilde{c}_k \\ \tilde{d}_k \end{bmatrix} = \overline{D} \begin{bmatrix} d^*_{-k} \\ c^*_{-k} \\ c_k \\ d_k \end{bmatrix} \quad (25)$$

Four intermediate variables $$\begin{bmatrix} \tilde{d}_{-k} \\ \tilde{c}_{-k} \\ \tilde{c}_k \\ \tilde{d}_k \end{bmatrix}$$

are obtained. The following may be obtained with reference to formula (24):

$$\begin{bmatrix} \overline{d}^*_{-k} \\ \overline{c}^*_{-k} \\ \overline{c}_k \\ \overline{d}_k \end{bmatrix} = \begin{bmatrix} \tilde{d}_{-k} \\ \tilde{c}_{-k} \\ \tilde{c}_k \\ \tilde{d}_k \end{bmatrix} \quad (26)$$

The following may be calculated on the basis of formula (26):

$$\begin{bmatrix} \overline{d}_{-k} \\ \overline{c}_{-k} \\ \overline{c}_k \\ \overline{d}_k \end{bmatrix} = \begin{bmatrix} \tilde{d}^*_{-k} \\ \tilde{c}^*_{-k} \\ \tilde{c}_k \\ \tilde{d}_k \end{bmatrix} \quad (27)$$

In conclusion, to achieve an effect of $$\begin{bmatrix} \overline{d}^*_{-k} \\ \overline{c}^*_{-k} \\ \overline{c}_k \\ \overline{d}_k \end{bmatrix} = \overline{D} \begin{bmatrix} d^*_{-k} \\ c^*_{-k} \\ c_k \\ d_k \end{bmatrix}$$

at the compressive sampling receiving device, $\overline{D}$ may be selected as a precoding matrix and the foregoing conjugate operation may be performed twice. Alternatively, a proper precoding matrix may be selected, so that an effect of the foregoing conjugate operation performed twice is directly achieved after the precoding matrix is multiplied by $$\begin{bmatrix} d_{-k} \\ c_{-k} \\ c_k \\ d_k \end{bmatrix},$$

which is not specifically limited in this embodiment of the present invention.

It should be noted that the foregoing descriptions are exemplary descriptions for ease of understanding in which an OFDM system is used as an example and two narrowband signals are used, but this embodiment of the present invention is not limited to the OFDM system and may use any other frequency division system. The following describes in detail a signal processing method in an embodiment of the present invention with reference to FIG. 10.

Figure 10:
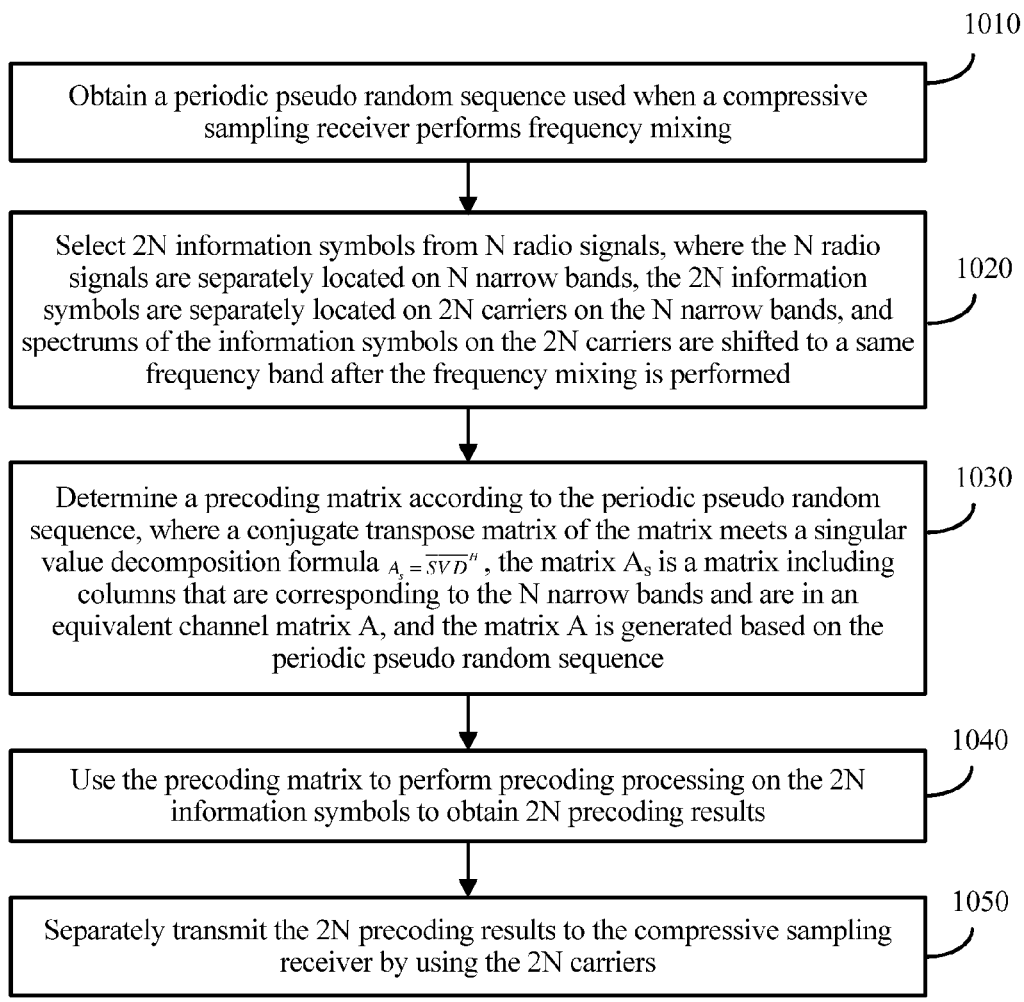
FIG. 10 is a schematic flowchart of a signal processing method according to an embodiment of the present invention.

FIG. 10 is a schematic flowchart of a signal processing method according to an embodiment of the present invention. The method in FIG. 10 may be executed by a transmit end that may be, for example, UE or a base station. The method in FIG. 10 may include the following steps.

1010. Obtain a periodic pseudo random sequence used when a compressive sampling receiving device performs frequency mixing.

It should be noted that a quantity of periodic pseudo random sequences used by the compressive sampling receiving device is equal to a quantity of sampling channels of the compressive sampling receiving device. That is, one periodic pseudo random sequence is used for each sampling channel, and periodic pseudo random sequences are different for different sampling channels.

Step 1010 may include: receiving signaling sent by the compressive sampling receiving device, where the signaling is used to indicate a serial number of each periodic pseudo random sequence in the periodic pseudo random sequence; and obtaining, from a prestored periodic pseudo random sequence set according to the signaling, the periodic pseudo random sequence corresponding to the serial number. Certainly, the foregoing periodic pseudo random sequence set may not be prestored, and a compressive sampling receiving device directly sends, to the transmit end, a spread spectrum sequence used by the compressive sampling receiving device.

1020. Select 2N information symbols from N radio signals, where the N radio signals are separately located on N narrow bands, the 2N information symbols are separately located on 2N carriers on the N narrow bands, and spectrums of the information symbols on the 2N carriers are shifted to a same frequency band after the frequency mixing is performed.

It should be understood that information symbols on which 2N carriers on the N narrow bands are shifted to a same frequency band at the compressive sampling receiving device may be learned beforehand. In other words, information symbols on which 2N carriers in the N radio signals interfere with each other at the compressive sampling receiving device may be learned beforehand.

Optionally, step 1020 may include: selecting the 2N carriers from the N narrow bands according to a frequency $f_p$ of the periodic pseudo random sequence, where the 2N carriers meet the following condition: after the frequency mixing is performed, the spectrums on the 2N carriers are shifted to the same frequency band in a frequency mixing interval $[-f_p/2, +f_p/2]$; and selecting the information symbols on the 2N carriers as the 2N information symbols.

Specifically, from formula (10), it can be learned that a spectrum shift manner of the compressive sampling compressive sampling receiving device is related to the frequency $f_p$ (a reciprocal of a period $T_p$) of the periodic pseudo random sequence. With $f_p$, it can be learned that the compressive sampling receiving device shifts an entire spectrum that includes the N narrow bands to the frequency band $[-f_p/2, +f_p/2]$ on a per $f_p$ basis. Because the transmit end knows the frequency band on which the to-be-transmitted N radio signals are located, it can be determined which frequency bands are shifted to the frequency band $[-f_p/2, +f_p/2]$ and information symbols on which carriers on the frequency band interfere with each other after the spectrum shift manner is applied. Referring to formula (19), $$y_k = A_s \begin{bmatrix} d^*_{-k} \\ c^*_{-k} \\ c_k \\ d_k \end{bmatrix} + w$$

is received at the compressive sampling receiving device. That is, information symbols on the $k^{th}$ carrier and the $-k^{th}$ carrier of a narrowband signal 1 and the $k^{th}$ carrier and the $-k^{th}$ carrier of a narrowband signal 2 are shifted to a same frequency band, and mutual interference occurs. Information symbols $d_{-k}$, $c_{-k}$, $c_k$, and $d_k$ on the four carriers are selected from the two narrowband signals.

It should be understood that in different communications systems or communications modes, specific types of the foregoing information symbols may be different, which is not specifically limited in this embodiment of the present invention. Specifically, the foregoing information symbols may be information symbols that are obtained by quadrature amplitude modulation (QAM) processing, for example, may be OFDM symbols.

The foregoing radio signals may be signals that occupy a preset continuous frequency band, and, for example, may be OFDM signals or narrowband signals in an OFDM system.

The foregoing narrow bands may be a frequency range allocated beforehand. In the OFDM system, the narrow bands may be subbands.

1030. Determine a precoding matrix $\overline{D}$ according to the periodic pseudo random sequence, where a conjugate transpose matrix $\overline{D}^H$ of the matrix $\overline{D}$ meets a singular value decomposition formula $A_s = \overline{S}\overline{V}\overline{D}^H$, the matrix A is a matrix including columns that are corresponding to the N narrow bands and are in an equivalent channel matrix A, and the matrix A is generated based on the periodic pseudo random sequence.

Specifically, A=SFD. The $i^{th}$ row in S is a value of a period of $p_i(t)$, F is a DFT matrix, D is a diagonal matrix, and a value of each entry may be regarded as a constant. For a specific generation manner, reference may be made to descriptions about formula (11) to formula (16) above, and details are not described herein.

The columns corresponding to the foregoing N narrow bands may be columns that are in the matrix A and that have same Numbers as nonzero rows in a matrix Z, the matrix Z meets: Y=AZ, and the matrix Y is a received signal matrix corresponding to the N radio signals.

Specifically, from formula (10), it can be learned that the entire spectrum that includes the N narrow bands is shifted to the frequency band $[-f_p/2, +f_p/2]$ on the per $f_p$ basis according to the frequency $f_p$ of the periodic pseudo random sequence. After knowing frequency bands on which the N narrow bands are located and the foregoing spectrum shift manner, the transmit end can determine which rows in the matrix Z are zero rows and which rows are nonzero rows (that is, signal spectrum information is included). It should be noted that herein, the matrix Z does not need to be calculated, and only zero rows or nonzero rows in the matrix Z need to be determined.

A specific form of the matrix $\overline{D}$ is described by using FIG. 7 to FIG. 9 as an example. From FIG. 7, it can be learned that signals on the following frequency bands are shifted to $[-f_p/2, f_p/2]$: $[-9f_p/2, -7f_p/2]$, $[-5f_p/2, -3f_p/2]$, $[3f_p/2, 5f_p/2]$, and $[7f_p/2, 9f_p/2]$, and shift results for other frequency bands are all zero. As shown in FIG. 8 and FIG. 9, it can be learned beforehand that the $1^{st}$, $3^{rd}$, $7^{th}$, and $9^{th}$ rows in the matrix Z are not zero. Subsequently, the $1^{st}$, $3^{rd}$, $7^{th}$, and $9^{th}$ columns in the matrix A are retained to obtain the matrix $A_s$, and singular value decomposition $A_s = \overline{S}\overline{V}\overline{D}^H$ is performed on the matrix A to determine the precoding matrix $\overline{D}$.

1040. Use the precoding matrix to perform precoding processing on the 2N information symbols to obtain 2N precoding results.

Actually, there may be multiple precoding processing manners. An implementation manner that makes a received vector y corresponding to the 2N precoding results meet $y = A_s \overline{D} z$ at the compressive sampling receiving device end after the precoding processing is performed shall fall within the protection scope of the embodiments of the present invention, which is described in detail subsequently.

Herein z is not a column vector that includes the 2N information symbols, but is a 2N-dimensional column vector obtained after one half of the 2N information symbols are taken a conjugate of and the other half are kept unchanged. For details, refer to descriptions about formula (18) and formula (19). The foregoing is decided by a spectrum shift characteristic of this type of existing compressive sampling receiving device. It should also be noted that z herein may be any column in a matrix Z' obtained after nonzero rows in the foregoing matrix Z are retained.

1050. Separately transmit the 2N precoding results to the compressive sampling receiving device by using the 2N carriers.

Because the selected 2N information symbols are shifted to the same frequency band at the compressive sampling compressive sampling receiving device, if the 2N information symbols are transmitted directly, the corresponding received vector y at the compressive sampling receiving device meets $y=A_s z$. $z$ is a column vector converted from the 2N information symbols. Because each entry in the matrix $A_s$ is a nonzero entry, interference occurs between the 2N information symbols inevitably. In this embodiment of the present invention, the precoding matrix $\overline{D}$ is generated according to the periodic pseudo random sequence used by the compressive sampling receiving device, and the 2N precoding results obtained after processing by using the precoding matrix $\overline{D}$ are transmitted to the compressive sampling receiving device. Because the received vector y at the compressive sampling receiving device meets $y=A_s\overline{D}z$, which is further expanded to $y=\overline{S}\overline{V}z$, when the compressive sampling receiving device left-multiplies $\overline{S}^H$ by the vector y, a final received vector y' obtained meets $y'=\overline{V}z$. Because $\overline{V}$ is a diagonal matrix in singular value decomposition, orthogonality is met between the 2N information symbols, thereby avoiding mutual interference and increasing an SINR of a received signal.

The following describes in detail a precoding processing manner. Optionally, in an embodiment, referring to FIG. 11, step 1040 may include the following steps.

1110. Take a conjugate of one half of the 2N information symbols, and keep the other half unchanged, to obtain 2N to-be-precoded entries.

Optionally, in an embodiment, step 1110 may include: determining N target carriers from the 2N carriers, where the target carriers are carriers on which information symbols are taken a conjugate of after undergoing compressive sampling performed by the compressive sampling receiving device; and taking a conjugate of the information symbols that are in the 2N information symbols and are located on the N target carriers.

The foregoing implementation manner in which the transmit end transmits $$\begin{bmatrix} d_{-k} \\ c_{-k} \\ c_k \\ d_k \end{bmatrix}$$

and the compressive sampling receiving device receives $$y_k = A_s \begin{bmatrix} d^*_{-k} \\ c^*_{-k} \\ c_k \\ d_k \end{bmatrix} + w$$

is used as an example. It can be learned that if the information symbols on the $-k^{th}$ carrier of the narrowband signal 1 and the $-k^{th}$ carrier of the narrowband signal 2 are taken a conjugate of at the compressive sampling receiving device, the two carriers are determined as target carriers. Information symbols on the target carriers are taken a conjugate of to obtain to-be-precoded entries $$\begin{bmatrix} d^*_{-k} \\ c^*_{-k} \\ c_k \\ d_k \end{bmatrix}.$$

1120. Multiply the precoding matrix by a column vector that includes the 2N to-be-precoded entries, to obtain 2N intermediate entries.

For example, the to-be-precoded entries $$\begin{bmatrix} d^*_{-k} \\ c^*_{-k} \\ c_k \\ d_k \end{bmatrix}$$

in step 1110 are multiplied by the precoding matrix $\overline{D}$ to obtain intermediate entries $$\begin{bmatrix} \tilde{d}_{-k} \\ \tilde{c}_{-k} \\ \tilde{c}_k \\ \tilde{d}_k \end{bmatrix},$$

as shown in formula (25).

1130. Take a conjugate of one half of the 2N intermediate entries, and keep the other half unchanged, to obtain the 2N precoding results.

Optionally, in an embodiment, step 1130 may include: taking a conjugate of intermediate entries that are in the 2N intermediate entries and are converted from the information symbols on the N target carriers.

For example, intermediate entries that are in the intermediate entries $$\begin{bmatrix} \tilde{d}_{-k} \\ \tilde{c}_{-k} \\ \tilde{c}_k \\ \tilde{d}_k \end{bmatrix}$$

obtained in step 1120 and are corresponding to the $-k^{th}$ carrier of the narrowband signal 1 and the $-k^{th}$ carrier of the narrowband signal 2 are taken a conjugate of to obtain $$\begin{bmatrix} \tilde{d}^*_{-k} \\ \tilde{c}^*_{-k} \\ \tilde{c}_k \\ \tilde{d}_k \end{bmatrix},$$

as shown in formula (27). Subsequently, $\tilde{d}_{-k}^*$ and $\tilde{d}_k$ are transmitted instead respectively on the $-k^{th}$ carrier and the $k^{th}$ carrier of the narrowband signal 1; and $\tilde{c}_{-k}^*$ and $\tilde{c}_k$ are transmitted instead respectively on the $-k^{th}$ carrier and the $k^{th}$ carrier of the narrowband signal 2.

Figure 11:
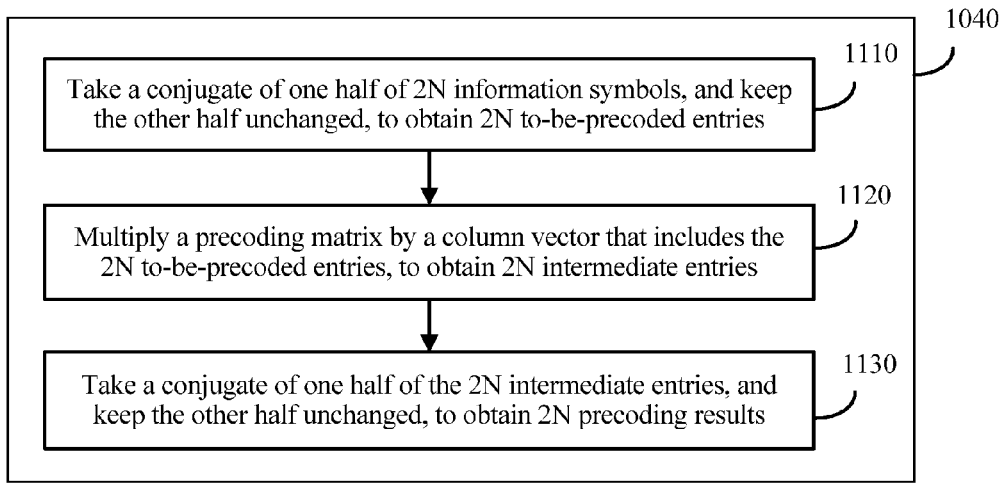
FIG. 11 is a schematic flowchart of a precoding processing process.

It should be noted that FIG. 11 is merely an example of a precoding processing manner. Actually, the precoding matrix may be transformed, so that the foregoing 2N precoding results are directly obtained after a transformed precoding matrix is directly multiplied by the column vector that includes the 2N information symbols. In other words, a specific form of the precoding matrix is changed, so that the precoding matrix also has a role of taking a conjugate twice.

Figure 12:
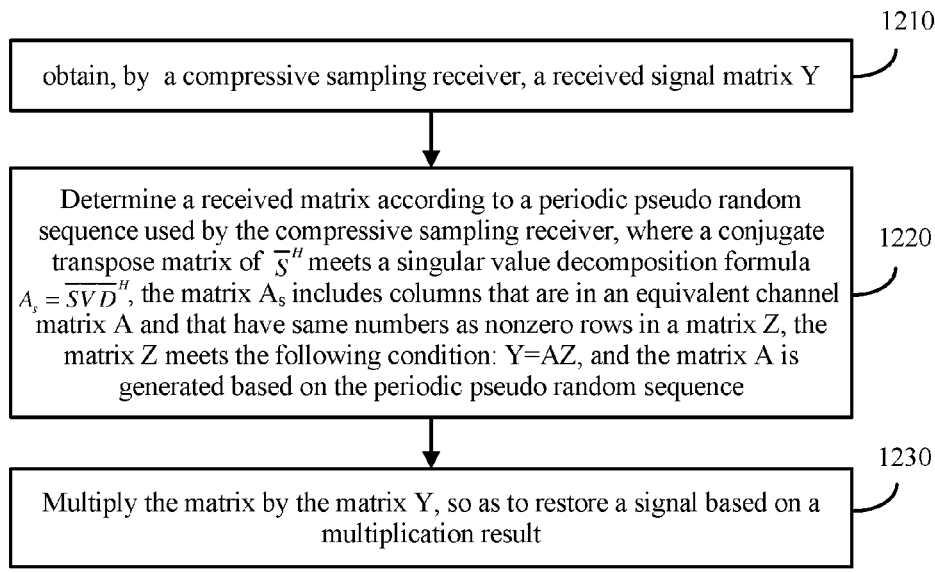
FIG. 12 is a schematic flowchart of a signal processing method according to an embodiment of the present invention.

The foregoing describes in detail the signal processing method according to the embodiments of the present invention with reference to FIG. 1 to FIG. 11 from a perspective of a transmit end, and the following describes in detail a signal processing method according to the embodiments of the present invention with reference to FIG. 12 from a perspective of a compressive sampling receiving device. It should be understood that interaction between a transmit end and a compressive sampling receiving device, related characteristics and functions, and the like described from a compressive sampling receiving device side correspond to those described from a transmit end side. For brevity, repeated descriptions are properly omitted.

FIG. 12 is a schematic flowchart of a signal processing method according to an embodiment of the present invention. The method in FIG. 12 is executed by a compressive sampling receiving device that may be, for example, UE or a base station. The method in FIG. 12 includes the following steps.

1210. Use the compressive sampling receiving device to obtain a received signal matrix Y.

1220. Determine a received matrix $\overline{S}^H$ according to a periodic pseudo random sequence used by the compressive sampling receiving device, where a conjugate transpose matrix $\overline{S}$ of $\overline{S}^H$ meets a singular value decomposition formula $A_s = \overline{S}\overline{V}\overline{D}^H$, the matrix $A_s$ includes columns that are in an equivalent channel matrix A and that have same Numbers as nonzero rows in a matrix Z, the matrix Z meets: Y=AZ, and the matrix A is generated based on the periodic pseudo random sequence.

The nonzero rows in the matrix Z may be obtained by calculating Y=AZ first to obtain the matrix Z and then finding Numbers of the nonzero rows in the matrix Z; or a transmit end may send the NUMBER information to the compressive sampling receiving device by using signaling (for a manner of determining the nonzero rows in the matrix Z by the transmit end, refer to descriptions about FIG. 10).

1230. Multiply the matrix $\overline{S}^H$ by the matrix Y, so as to restore a signal based on a multiplication result.

When the transmit end sends all precoding results in a manner described in FIG. 10, the compressive sampling receiving device left-multiplies the received matrix by $\overline{S}^H$. The multiplication result can ensure that each received vector y' in the received matrix Y meets y'=$\overline{V}$z. Because $\overline{V}$ is a diagonal matrix in singular value decomposition, orthogonality is met between the 2N information symbols, thereby avoiding mutual interference and increasing an SINR of a received signal.

Optionally, in an embodiment, before the using the compressive sampling receiving device to obtain a received signal matrix Y, the method in FIG. 12 may further include: sending signaling to a transmitter, where the signaling is used to indicate a serial number of the periodic pseudo random sequence, the serial number is preset, and the serial number is used by the transmitter to obtain each periodic pseudo random sequence from a prestored periodic pseudo random sequence set according to the serial number.

The foregoing describes in detail the signal processing method according to the embodiments of the present invention with reference to FIG. 1 to FIG. 12, and the following describes in detail a transmitter and a compressive sampling receiving device according to the embodiments of the present invention with reference to FIG. 13 to FIG. 16.

Figure 13:
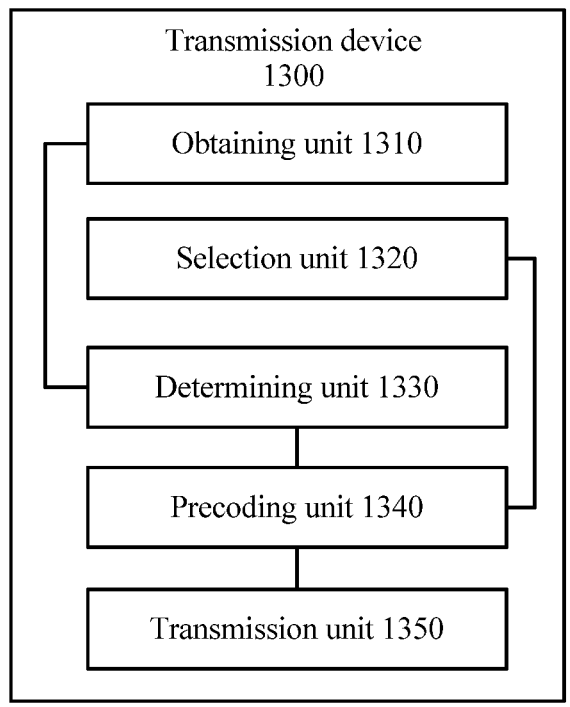
FIG. 13 is a schematic block diagram of a transmitter according to an embodiment of the present invention.

FIG. 13 is a schematic block diagram of a transmitter according to an embodiment of the present invention. It should be understood that a transmitter 1300 in FIG. 13 can implement steps executed by the transmit end above. To avoid repetition, details are not described herein. The transmitter 1300 includes: an obtaining unit 1310, configured to obtain a periodic pseudo random sequence used when a compressive sampling receiving device performs frequency mixing; a selection unit 1320, configured to select 2N information symbols from N radio signals, where the N radio signals are separately located on N narrow bands, the 2N information symbols are separately located on 2N carriers on the N narrow bands, and spectrums of the information symbols on the 2N carriers are shifted to a same frequency band after the frequency mixing is performed; a determining unit 1330, configured to determine a precoding matrix $\overline{D}$ according to the periodic pseudo random sequence, where a conjugate transpose matrix $\overline{D}^H$ of the matrix $\overline{D}$ meets a singular value decomposition formula $A_s = \overline{S}\overline{V}\overline{D}^H$, the matrix $A_s$ is a matrix including columns that are corresponding to the N narrow bands and are in an equivalent channel matrix A, and the matrix A is generated based on the periodic pseudo random sequence; a precoding unit 1340, configured to use the precoding matrix determined by the determining unit 1330 to perform precoding processing on the 2N information symbols selected by the selection unit 1320, to obtain 2N precoding results; and a transmission unit 1350, configured to separately transmit, by using the 2N carriers, the 2N precoding results obtained by the precoding unit 1340 to the compressive sampling receiving device.

Because the selected 2N information symbols are shifted to the same frequency band at a compressive sampling compressive sampling receiving device, if the 2N information symbols are transmitted directly, a corresponding received vector y at the compressive sampling receiving device meets y=$A_s$z. z is a column vector converted from the 2N information symbols. (Herein z is not a column vector that includes the 2N information symbols, but is a column vector obtained after one half of the 2N information symbols are taken a conjugate of and the other half are kept unchanged. For details, refer to descriptions about formula (18) and formula (19). The foregoing is decided by a spectrum shift characteristic of this type of existing compressive sampling receiving device.) Because each entry in the matrix $A_s$ is a nonzero entry, interference occurs between the 2N information symbols inevitably. In this embodiment of the present invention, the precoding matrix $\overline{D}$ is generated according to the periodic pseudo random sequence used by the compressive sampling receiving device, and the 2N precoding results obtained after processing by using the precoding matrix $\overline{D}$ are transmitted to the compressive sampling receiving device. Because the received vector y at the compressive sampling receiving device meets y=$A_s\overline{D}$z, which is further expanded to y=$\overline{S}\overline{V}$z, when the compressive sampling receiving device left-multiplies $\overline{S}^H$ by the vector y, a final received vector y' obtained meets y'=$\overline{V}$z. Because $\overline{V}$ is a diagonal matrix in singular value decomposition, orthogonality is met between the 2N information symbols, thereby avoiding mutual interference and increasing an SINR of a received signal.

Optionally, in an embodiment, the precoding unit 1340 may be specifically configured to: take a conjugate of one half of the 2N information symbols, and keep the other half unchanged, to obtain 2N to-be-precoded entries; multiply the precoding matrix by a column vector that includes the 2N to-be-precoded entries, to obtain 2N intermediate entries; and take a conjugate of one half of the 2N intermediate entries, and keep the other half unchanged, to obtain the 2N precoding results.

Optionally, in an embodiment, the precoding unit 1340 may be specifically configured to: determine N target carriers from the 2N carriers, where the target carriers are carriers on which information symbols are taken a conjugate of after undergoing compressive sampling performed by the compressive sampling receiving device; and take a conjugate of the information symbols that are in the 2N information symbols and are located on the N target carriers.

Optionally, in an embodiment, the precoding unit 1340 may be specifically configured to take a conjugate of intermediate entries that are in the 2N intermediate entries and are converted from the information symbols on the N target carriers.

Optionally, in an embodiment, the transmission unit 1350 may be specifically configured to separately transmit the 2N precoding results to the compressive sampling receiving device by using the 2N carriers, where a precoding result transmitted by using each carrier is converted from an information symbol located on the carrier.

Optionally, in an embodiment, the obtaining unit 1310 may be specifically configured to: receive signaling sent by the compressive sampling receiving device, where the signaling is used to indicate a serial number of the periodic pseudo random sequence; and obtain, from a prestored periodic pseudo random sequence set according to the signaling, the periodic pseudo random sequence corresponding to the serial number.

Optionally, in an embodiment, the selection unit 1320 may be specifically configured to: select the 2N carriers from the N narrow bands according to a frequency $f_p$ of the periodic pseudo random sequence, where the 2N carriers meet the following condition: after the frequency mixing is performed, the spectrums on the 2N carriers are shifted to the same frequency band in a frequency mixing interval $[-f_p/2, +f_p/2]$; and select the information symbols on the 2N carriers as the 2N information symbols.

Optionally, in an embodiment, the columns corresponding to the N narrow bands are columns that are in the matrix A and that have same Numbers as nonzero rows in a matrix Z, the matrix Z meets: Y=AZ, and the matrix Y is a received signal matrix corresponding to the N radio signals.

Optionally, in an embodiment, each radio signal in the N radio signals is a signal that occupies a preset continuous frequency band.

Optionally, in an embodiment, the radio signals are OFDM signals, the narrow bands are subbands, the information symbols are OFDM symbols, and the carriers are subcarriers.

Figure 14:
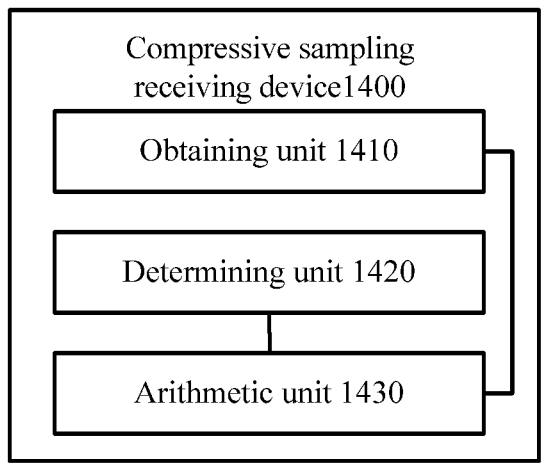
FIG. 14 is a schematic block diagram of a receiving device according to an embodiment of the present invention.

FIG. 14 is a schematic block diagram of a compressive sampling receiving device according to an embodiment of the present invention. It should be understood that a compressive sampling receiving device 1400 in FIG. 14 can implement steps executed by the compressive sampling receiving device above. To avoid repetition, details are not described herein. The receiving device 1400 may include: an obtaining unit 1410, configured to obtain a received signal matrix Y; a determining unit 1420, configured to determine a received matrix $\overline{S}_H$ according to a periodic pseudo random sequence used by the compressive sampling receiving device, where a conjugate transpose matrix $\overline{S}$ of $\overline{S}^H$ meets a singular value decomposition formula $A_s=\overline{SVD}^H$, the matrix $A_s$ includes columns that are in an equivalent channel matrix A and that have same Numbers as nonzero rows in a matrix Z, the matrix Z meets: Y=AZ, and the matrix A is generated based on the periodic pseudo random sequence; and an arithmetic unit 1430, configured to multiply the matrix $\overline{S}^H$ determined by the determining unit 1420 by the matrix Y obtained by the obtaining unit 1410, so as to restore a signal based on a multiplication result.

When a transmitter sends all precoding results in a manner described in FIG. 13, the compressive sampling receiving device left-multiplies the received matrix by $\overline{S}^H$. The multiplication result can ensure that each received vector y' in the received matrix Y meets $y'=\overline{V}z$. Because $\overline{V}$ is a diagonal matrix in singular value decomposition, orthogonality is met between the 2N information symbols, thereby avoiding mutual interference and increasing an SINR of a received signal.

Optionally, in an embodiment, the compressive sampling receiving device 1400 may further include: a sending unit, configured to send signaling to the transmitter, where the signaling is used to indicate a serial number of the periodic pseudo random sequence, the serial number is preset, and the serial number is used by the transmitter to obtain the periodic pseudo random sequence from a prestored periodic pseudo random sequence set according to the serial number.

Figure 15:
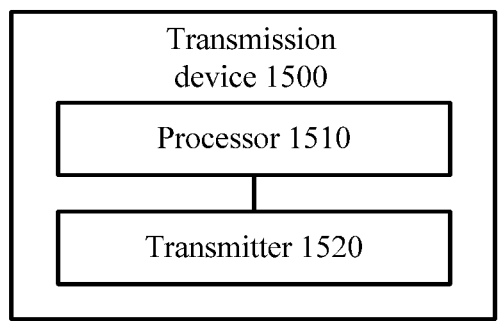
FIG. 15 is a schematic block diagram of a transmitter according to an embodiment of the present invention.

FIG. 15 is a schematic block diagram of a transmission device according to an embodiment of the present invention. It should be understood that a transmission device 1500 in FIG. 15 can implement steps executed by the transmit end above. To avoid repetition, details are not described herein. The transmission device 1500 includes: a processor 1510, configured to: obtain a periodic pseudo random sequence used when a compressive sampling receiving device performs frequency mixing; select 2N information symbols from N radio signals, where the N radio signals are separately located on N narrow bands, the 2N information symbols are separately located on 2N carriers on the N narrow bands, and spectrums of the information symbols on the 2N carriers are shifted to a same frequency band after the frequency mixing is performed; determine a precoding matrix $\overline{D}$ according to the periodic pseudo random sequence, where a conjugate transpose matrix $\overline{D}^H$ of the matrix $\overline{D}$ meets a singular value decomposition formula $A_s=\overline{SVD}^H$, the matrix A is a matrix including columns that are corresponding to the N narrow bands and are in an equivalent channel matrix A, and the matrix A is generated based on the periodic pseudo random sequence; and use the precoding matrix to perform precoding processing on the 2N information symbols to obtain 2N precoding results; and a transmitter 1520, configured to separately transmit, by using the 2N carriers, the 2N precoding results obtained by the processor 1510 to the compressive sampling receiving device, so that a received vector y corresponding to the 2N precoding results at the compressive sampling receiving device end meets $y=A_s\overline{D}z$.

Because the selected 2N information symbols are shifted to the same frequency band at the compressive sampling compressive sampling receiving device, if the 2N information symbols are transmitted directly, the corresponding received vector y at the compressive sampling receiving device meets $y=A_s x$. x is a column vector converted from the 2N information symbols. Because each entry in the matrix $A_s$ is a nonzero entry, interference occurs between the 2N information symbols inevitably. In this embodiment of the present invention, the precoding matrix $\overline{D}$ is generated according to the periodic pseudo random sequence used by the compressive sampling receiving device, and the 2N precoding results obtained after processing by using the precoding matrix $\overline{D}$ are transmitted to the compressive sampling receiving device. Because the received vector y at the compressive sampling receiving device meets $y=A_s\overline{D}z$, which is further expanded to $y=\overline{S}\overline{V}z$, when the compressive sampling receiving device left-multiplies $\overline{S}^H$ by the vector y, a final received vector y' obtained meets $y'=\overline{V}z$. Because $\overline{V}$ is a diagonal matrix in singular value decomposition, orthogonality is met between the 2N information symbols, thereby avoiding mutual interference and increasing an SINR of a received signal.

Optionally, in an embodiment, the processor 1510 may be specifically configured to: take a conjugate of one half of the 2N information symbols, and keep the other half unchanged, to obtain 2N to-be-precoded entries; multiply the precoding matrix by a column vector that includes the 2N to-be-precoded entries, to obtain 2N intermediate entries; and take a conjugate of one half of the 2N intermediate entries, and keep the other half unchanged, to obtain the 2N precoding results.

Optionally, in an embodiment, the processor 1510 may be specifically configured to: determine N target carriers from the 2N carriers, where the target carriers meet the following condition: after undergoing compressive sampling performed by the compressive sampling receiving device, information symbols located on the target carriers are taken a conjugate of; and take a conjugate of the information symbols that are in the 2N information symbols and are located on the N target carriers.

Optionally, in an embodiment, the processor 1510 may be specifically configured to take a conjugate of intermediate entries that are in the 2N intermediate entries and are converted from the information symbols on the N target carriers.

Optionally, in an embodiment, the transmitter 1520 may be specifically configured to separately transmit the 2N precoding results to the compressive sampling receiving device by using the 2N carriers, where a precoding result transmitted by using each carrier is converted from an information symbol located on the carrier.

Optionally, in an embodiment, the processor 1510 may be specifically configured to: receive signaling sent by the compressive sampling receiving device, where the signaling is used to indicate a serial number of the periodic pseudo random sequence; and obtain, from a prestored periodic pseudo random sequence set according to the signaling, the periodic pseudo random sequence corresponding to the serial number.

Optionally, in an embodiment, the processor 1510 may be specifically configured to: select the 2N carriers from the N narrow bands according to a frequency $f_p$ of the periodic pseudo random sequence, where the 2N carriers meet the following condition: after the frequency mixing is performed, the spectrums on the 2N carriers are shifted to the same frequency band in a frequency mixing interval $[-f_p/2, +f_p/2]$; and select the information symbols on the 2N carriers as the 2N information symbols.

Optionally, in an embodiment, the columns corresponding to the N narrow bands are columns that are in the matrix A and that have same Numbers as nonzero rows in a matrix Z, the matrix Z meets: $Y=AZ$, and the matrix Y is a received signal matrix corresponding to the N radio signals.

Optionally, in an embodiment, each radio signal in the N radio signals is a signal that occupies a preset continuous frequency band.

Optionally, in an embodiment, the radio signals are OFDM signals, the narrow bands are subbands, the information symbols are OFDM symbols, and the carriers are subcarriers.

Figure 16:
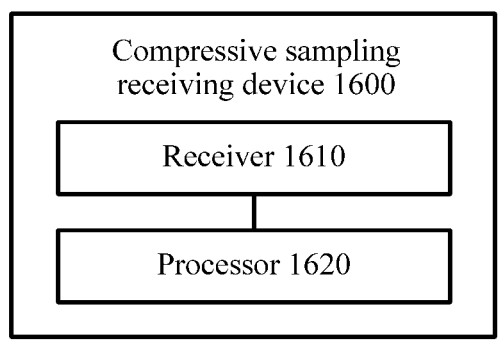
FIG. 16 is a schematic block diagram of a receiving device according to an embodiment of the present invention.

FIG. 16 is a schematic block diagram of a compressive sampling receiving device according to an embodiment of the present invention. It should be understood that a compressive sampling receiving device 1600 in FIG. 16 can implement steps executed by the compressive sampling receiving device above. To avoid repetition, details are not described herein. The receiving device 1600 may include: a receiver 1610, configured to obtain a received signal; and a processor 1620, configured to: determine a received matrix $\overline{S}^H$ according to a periodic pseudo random sequence used by the compressive sampling receiving device, where a conjugate transpose matrix $\overline{S}$ of $\overline{S}^H$ meets a singular value decomposition formula $A_s=\overline{SVD}^H$, the matrix $A_s$ includes columns that are in an equivalent channel matrix A and that have same Numbers as nonzero rows in a matrix Z, the matrix Z meets: $Y=AZ$, and the matrix A is generated based on the periodic pseudo random sequence; and multiply the matrix $\overline{S}^H$ by the matrix Y, so as to restore a signal based on a multiplication result.

When a transmission device sends all precoding results in a manner described in FIG. 15, the compressive sampling receiving device left-multiplies the received matrix by $\overline{S}^H$. The multiplication result can ensure that each received vector y in the received matrix Y meets $y'=\overline{V}z$. Because $\overline{V}$ is a diagonal matrix in singular value decomposition, orthogonality is met between the 2N information symbols, thereby avoiding mutual interference and increasing an SINR of a received signal.

Optionally, in an embodiment, the compressive sampling receiving device 1600 may further include: a sending device, configured to send signaling to the transmission device, where the signaling is used to indicate a serial number of the periodic pseudo random sequence, the serial number is preset, and the serial number is used by the transmission device to obtain the periodic pseudo random sequence from a prestored periodic pseudo random sequence set according to the serial number.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the embodiments provided in this application, it should be understood that the disclosed system, apparatus, and method may be implemented in other manners. For example, the described apparatus embodiment is merely exemplary. For example, the unit division is merely logical function division and may be other division in actual implementation. For example, multiple units or components may be combined or integrated into another system, or some features may be ignored or not performed. In addition, the shown or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separated, and parts shown as units may or may not be physical units, may be located in one position, or may be distributed on multiple network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of the present invention. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method, comprising:
    obtaining a periodic pseudo random sequence used when a compressive sampling receiving device performs frequency mixing;
    selecting 2N information symbols from N radio signals, wherein the N radio signals are separately located on N narrow bands, the 2N information symbols are separately located on 2N carriers on the N narrow bands, and spectrums of the 2N information symbols on the 2N carriers are shifted to a same frequency band after the frequency mixing is performed, and N is an integer greater than or equal to 1;
    determining a precoding matrix $\overline{D}$ according to the periodic pseudo random sequence, wherein a conjugate transpose matrix $\overline{D}^H$ of the precoding matrix $\overline{D}$ meets a singular value decomposition formula $A_s = \overline{S V D}^H$, wherein matrix $A_s$ is a matrix comprising columns that correspond to the N narrow bands and that are in an equivalent channel matrix A, and the matrix A is generated based on the periodic pseudo random sequence, and wherein $\overline{S}$ is a conjugate transpose matrix of a received matrix $\overline{S}^H$, and $\overline{V}$ is a diagonal matrix; and
    using the precoding matrix to perform precoding processing on the 2N information symbols to obtain 2N precoding results, and separately transmitting the 2N precoding results to the compressive sampling receiving device using the 2N carriers.

2. The method according to claim 1, wherein using the precoding matrix to perform precoding processing on the 2N information symbols to obtain 2N precoding results comprises:
    taking a conjugate of one half of the 2N information symbols, and keeping the other half unchanged, to obtain 2N to-be-precoded entries;
    multiplying the precoding matrix by a column vector that comprises the 2N to-be-precoded entries, to obtain 2N intermediate entries; and
    taking a conjugate of one half of the 2N intermediate entries, and keeping the other half unchanged, to obtain the 2N precoding results.

3. The method according to claim 2, wherein taking a conjugate of one half of the 2N information symbols comprises:
    determining N target carriers from the 2N carriers, wherein the N target carriers meet the following condition: after undergoing compressive sampling performed by the compressive sampling receiving device, information symbols located on the N target carriers are taken a conjugate of; and
    taking a conjugate of the information symbols that are in the 2N information symbols and are located on the N target carriers.

4. The method according to claim 3, wherein taking the conjugate of one half of the 2N intermediate entries comprises:
    taking the conjugate of intermediate entries that are in the 2N intermediate entries and are converted from the information symbols on the N target carriers.

5. The method according to claim 4, wherein separately transmitting the 2N precoding results to the compressive sampling receiving device using the 2N carriers comprises:
    separately transmitting the 2N precoding results to the compressive sampling receiving device using the 2N carriers, wherein a precoding result transmitted by using each carrier is converted from an information symbol located on the carrier.

6. The method according to claim 1, wherein obtaining the periodic pseudo random sequence used when the compressive sampling receiving device performs frequency mixing comprises:
    receiving signaling sent by the compressive sampling receiving device, wherein the signaling indicates a serial number of the periodic pseudo random sequence; and
    obtaining, from a prestored periodic pseudo random sequence set according to the signaling, the periodic pseudo random sequence corresponding to the serial number.

7. The method according to claim 1, wherein selecting the 2N information symbols from N radio signals comprises:
    selecting the 2N carriers from the N narrow bands according to a frequency $f_p$ of the periodic pseudo random sequence, wherein the 2N carriers meet the following condition: after the frequency mixing is performed, the spectrums on the 2N carriers are shifted to the same frequency band in a frequency mixing interval $[-f_p/2, +f_p/2]$; and
    selecting the 2N information symbols on the 2N carriers as the 2N information symbols.

8. The method according to claim 1, wherein the columns corresponding to the N narrow bands are columns that are in the matrix A and that have same numbers as nonzero rows in a matrix Z, the matrix Z meets: Y=AZ, and matrix Y is a received signal matrix corresponding to the N radio signals.

9. The method according to claim 1, wherein each radio signal in the N radio signals is a signal that occupies a preset continuous frequency band.

10. The method according to a claim 1, wherein the N radio signals are orthogonal frequency division multiplexing (OFDM) signals, the N narrow bands are subbands, the 2N information symbols are OFDM symbols, and the 2N carriers are subcarriers.

11. A method, comprising:
  obtaining, by a compressive sampling receiving device, a received signal matrix Y;
  determining a received matrix $\overline{S}^H$ according to a periodic pseudo random sequence used by the compressive sampling receiving device, wherein a conjugate transpose matrix $\overline{S}$ of $\overline{S}^H$ meets a singular value decomposition formula $A_s = \overline{SV}\overline{D}^H$, wherein matrix $A_s$ comprises columns that are in an equivalent channel matrix A and that have same numbers as nonzero rows in a matrix Z, the matrix Z meets: Y=AZ, and the matrix A is generated based on the periodic pseudo random sequence, and wherein $\overline{D}^H$ is a conjugate transpose matrix of a precoding matrix $\overline{D}$, and $\overline{V}$ is a diagonal matrix; and
  multiplying the matrix $\overline{S}^H$ by the matrix Y, so as to restore a signal based on a multiplication result.

12. The method according to claim 11, wherein before obtaining the received signal matrix Y, the method further comprises:
  sending signaling to a transmission device, wherein the signaling indicates a serial number of the periodic pseudo random sequence, the serial number is preset, and the serial number is used by the transmission device to obtain the periodic pseudo random sequence from a prestored periodic pseudo random sequence set according to the serial number.

13. A transmission device, comprising:
  a processor; and
  a computer-readable storage medium storing a program to be executed by the processor, the program including instructions for:
    obtaining a periodic pseudo random sequence used when a compressive sampling receiving device performs frequency mixing;
    selecting 2N information symbols from N radio signals, wherein the N radio signals are separately located on N narrow bands, the 2N information symbols are separately located on 2N carriers on the N narrow bands, spectrums of the 2N information symbols on the 2N carriers are shifted to a same frequency band after the frequency mixing is performed, and N is an integer greater than or equal to 1;
    determining a precoding matrix $\overline{D}$ according to the periodic pseudo random sequence, wherein a conjugate transpose matrix $\overline{D}^H$ of the precoding matrix $\overline{D}$ meets a singular value decomposition formula $A_s = \overline{SV}\overline{D}^H$, wherein matrix $A_s$ is a matrix comprising columns that correspond to the N narrow bands and that are in an equivalent channel matrix A, and the matrix A is generated based on the periodic pseudo random sequence, and wherein $\overline{S}$ is a conjugate transpose matrix of a received matrix $\overline{S}^H$, and $\overline{V}$ is a diagonal matrix; and
    using the precoding matrix to perform precoding processing on the 2N information symbols, to obtain 2N precoding results; and
  a transmitter, configured to separately transmit, using the 2N carriers, the 2N precoding results to the compressive sampling receiving device.

14. The transmission device according to claim 13, wherein the program further includes instructions for:
  taking a conjugate of one half of the 2N information symbols, and keeping the other half unchanged, to obtain 2N to-be-precoded entries;
  multiplying the precoding matrix by a column vector that comprises the 2N to-be-precoded entries, to obtain 2N intermediate entries; and
  taking a conjugate of one half of the 2N intermediate entries, and keeping the other half unchanged, to obtain the 2N precoding results.

15. The transmission device according to claim 14, wherein the program further includes instructions for:
  determining N target carriers from the 2N carriers, wherein the N target carriers meet the following condition: after undergoing compressive sampling performed by the compressive sampling receiving device, information symbols located on the N target carriers are taken a conjugate of; and
  taking a conjugate of the information symbols that are in the 2N information symbols and are located on the N target carriers.

16. The transmission device according to claim 15, wherein the program further includes instructions for taking a conjugate of intermediate entries that are in the 2N intermediate entries and are converted from the information symbols on the N target carriers.

17. The transmission device according to claim 16, wherein the program further includes instructions for separately transmitting the 2N precoding results to the compressive sampling receiving device using the 2N carriers, wherein a precoding result transmitted using each carrier is converted from an information symbol located on the carrier.

18. The transmission device according to claim 13, wherein the program further includes instructions for:
  receiving signaling sent by the compressive sampling receiving device, wherein the signaling indicates a serial number of the periodic pseudo random sequence; and
  obtaining, from a prestored periodic pseudo random sequence set according to the signaling, the periodic pseudo random sequence corresponding to the serial number.

19. The transmission device according to claim 13, wherein the program further includes instructions for:
  selecting the 2N carriers from the N narrow bands according to a frequency $f_p$ of the periodic pseudo random sequence, wherein the 2N carriers meet the following condition: after the frequency mixing is performed, the spectrums on the 2N carriers are shifted to the same frequency band in a frequency mixing interval $[-f_p/2, +f_p/2]$; and
  selecting the 2N information symbols on the 2N carriers as the 2N information symbols.

20. The transmission device according to claim 13, wherein the columns corresponding to the N narrow bands are columns that are in the matrix A and that have same numbers as nonzero rows in a matrix Z, the matrix Z meets: Y=AZ, and matrix Y is a received signal matrix corresponding to the N radio signals.

21. The transmission device according to claim 13, wherein each radio signal in the N radio signals is a signal that occupies a preset continuous frequency band.

22. The transmission device according to claim 13, wherein the N radio signals are orthogonal frequency division multiplexing (OFDM) signals, the N narrow bands are subbands, the 2N information symbols are OFDM symbols, and the 2N carriers are subcarriers.

23. A compressive sampling receiving device, comprising:
- a processor; and
- a computer-readable storage medium storing a program to be executed by the processor, the program including instructions for:
  - obtaining a received signal matrix Y;
  - determining a received matrix $\overline{S}^H$ according to a periodic pseudo random sequence used by the compressive sampling receiving device, wherein a conjugate transpose matrix $\overline{S}$ of $\overline{S}^H$ meets a singular value decomposition formula $A_s = \overline{S}\overline{V}\overline{D}^H$, the matrix $A_s$ comprises columns that are in an equivalent channel matrix A and that have same numbers as nonzero rows in a matrix Z, the matrix Z meets: Y=AZ, and the matrix A is generated based on the periodic pseudo random sequence, and wherein $\overline{D}^H$ is a conjugate transpose matrix of a precoding matrix $\overline{D}$, and $\overline{V}$ is a diagonal matrix; and
  - multiplying the matrix $\overline{S}^H$ by the matrix Y, so as to restore a signal based on a multiplication result.

24. The compressive sampling receiving device according to claim 23, further comprising:
- a transmitter, configured to send signaling to a transmission device, wherein the signaling indicates a serial number of the periodic pseudo random sequence, the serial number is preset, and the serial number is used by the transmission device to obtain the periodic pseudo random sequence from a prestored periodic pseudo random sequence set according to the serial number.

* * * * *